United States Patent
Tatsumura et al.

(10) Patent No.: US 9,691,476 B2
(45) Date of Patent: Jun. 27, 2017

(54) MULTI-CONTEXT CONFIGURATION MEMORY

(71) Applicant: KABUSHIKI KAISHA TOSHIBA, Tokyo (JP)

(72) Inventors: Kosuke Tatsumura, Kanagawa (JP); Mari Matsumoto, Kanagawa (JP); Masato Oda, Kanagawa (JP); Koichiro Zaitsu, Kanagawa (JP); Shinichi Yasuda, Japan (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/831,193

(22) Filed: Aug. 20, 2015

(65) Prior Publication Data

US 2015/0357032 A1    Dec. 10, 2015

Related U.S. Application Data

(63) Continuation of application No. PCT/JP2014/069798, filed on Jul. 28, 2014.

(30) Foreign Application Priority Data

Jul. 26, 2013 (JP) .................................. 2013-155993

(51) Int. Cl.
*G11C 13/00* (2006.01)
*G11C 11/16* (2006.01)
(Continued)

(52) U.S. Cl.
CPC ............ *G11C 13/004* (2013.01); *G11C 11/16* (2013.01); *G11C 13/0002* (2013.01);
(Continued)

(58) Field of Classification Search
CPC .............. G11C 13/004; G11C 13/0002; G11C 13/0004; G11C 13/0069; G11C 14/009;
(Continued)

(56) References Cited

U.S. PATENT DOCUMENTS 6,304,101 B1   10/2001   Nishihara
7,193,437 B2    3/2007   Cappelli et al.
(Continued)

FOREIGN PATENT DOCUMENTS

CN   101194320 A   6/2008
EP     1889261 A   2/2008
(Continued)

OTHER PUBLICATIONS

Hariyama, Masanori, et al., "Novel Switch Block Architecture Using Non-Volatile Functional Pass-gate for Multi-Context FPGAs", Proceedings of the IEEE Computer Society Annual Symposium on VLSI: New Frontiers in VLSI Desing, 5 pages, (2005).
(Continued)

*Primary Examiner* — J. H. Hur
(74) *Attorney, Agent, or Firm* — Finnegan, Henderson, Farabow, Garrett & Dunner, LLP

(57) ABSTRACT

According to one embodiment, an integrated circuit includes first and second data lines, a first memory cell includes first and second resistance changing elements connected in series between the first and second data lines and a first selection transistor including a drain connected to a connection node of the first and second resistance changing elements, and a second memory cell includes third and fourth resistance changing elements connected in series between the first and second data lines and a second selection transistor including a drain connected to a connection node of the third and fourth resistance changing elements.

8 Claims, 23 Drawing Sheets

(51) Int. Cl.
*H03K 19/177* (2006.01)
*G11C 14/00* (2006.01)

(52) U.S. Cl.
CPC ........ *G11C 13/003* (2013.01); *G11C 13/0004* (2013.01); *G11C 13/0023* (2013.01); *G11C 13/0069* (2013.01); *G11C 14/009* (2013.01); *H03K 19/1776* (2013.01); *G11C 2213/78* (2013.01)

(58) Field of Classification Search
CPC ... G11C 11/16; G11C 13/003; G11C 13/0023; G11C 2213/78; H03K 19/1776
See application file for complete search history.

(56) References Cited

U.S. PATENT DOCUMENTS

| | | | |
|---|---|---|---|
| 7,804,730 | B2 | 9/2010 | Redgrave et al. |
| 2002/0006058 | A1* | 1/2002 | Nakajima ............... G11C 11/16 365/171 |
| 2004/0225980 | A1 | 11/2004 | Cappelli et al. |
| 2005/0190597 | A1* | 9/2005 | Kato ....................... G11C 11/22 365/185.08 |
| 2006/0279981 | A1 | 12/2006 | Diao et al. |
| 2007/0159867 | A1 | 7/2007 | Muraoka et al. |
| 2007/0242529 | A1 | 10/2007 | Redgrave et al. |
| 2008/0170428 | A1 | 7/2008 | Kinoshita |
| 2010/0091549 | A1 | 4/2010 | Lee et al. |
| 2010/0182821 | A1 | 7/2010 | Muraoka et al. |
| 2012/0020159 | A1* | 1/2012 | Ong ................... G11C 14/0081 365/185.08 |
| 2012/0075910 | A1 | 3/2012 | Yasuda |
| 2012/0230105 | A1 | 9/2012 | Yasuda et al. |
| 2012/0326747 | A1 | 12/2012 | Jeong et al. |
| 2013/0247057 | A1* | 9/2013 | Fujimori ............... G06F 9/4806 718/102 |
| 2013/0258782 | A1 | 10/2013 | Tatsumura et al. |

FOREIGN PATENT DOCUMENTS

| | | |
|---|---|---|
| JP | 2001-28536 A | 1/2001 |
| JP | 2002-170374 A | 6/2002 |
| JP | 2007-514265 | 5/2007 |
| JP | 2008-243263 | 10/2008 |
| JP | 2008-546129 A | 12/2008 |
| JP | 2010-108595 | 5/2010 |
| JP | 2011-160370 A | 8/2011 |
| JP | 2012-74118 A | 4/2012 |
| JP | 2012-191455 A | 10/2012 |
| JP | 2013-13059 | 1/2013 |
| JP | 5665789 | 12/2014 |
| KR | 10-2008-0012981 A | 2/2008 |
| WO | WO 2006/133342 A2 | 12/2006 |
| WO | WO 2007/023569 A1 | 3/2007 |

OTHER PUBLICATIONS

Wong, H.-S. Philip, et al, "Metal-Oxide RRAM", Proceedings of the IEEE, vol. 100, pp. 1951-1970 (2012).
Liauw, Young Yang, at al., "Nonvolatile 3D-FPGA With Monolithically Stacked RRAM-Based Configuration Memory", IEEE International Solid-State Circuits Conference, Session 23, Advances in Heterogeneous Integration 23.4, pp. 406-408 (2012).
International Search Report issued in corresponding International Application No. PCT/JP2014/069798, mailed Oct. 28, 2014, 8 pages.
Written Opinion issued by the International Searching Authority on Feb. 4, 2016, in corresponding International Application No. PCT/JP2014/069798.

* cited by examiner

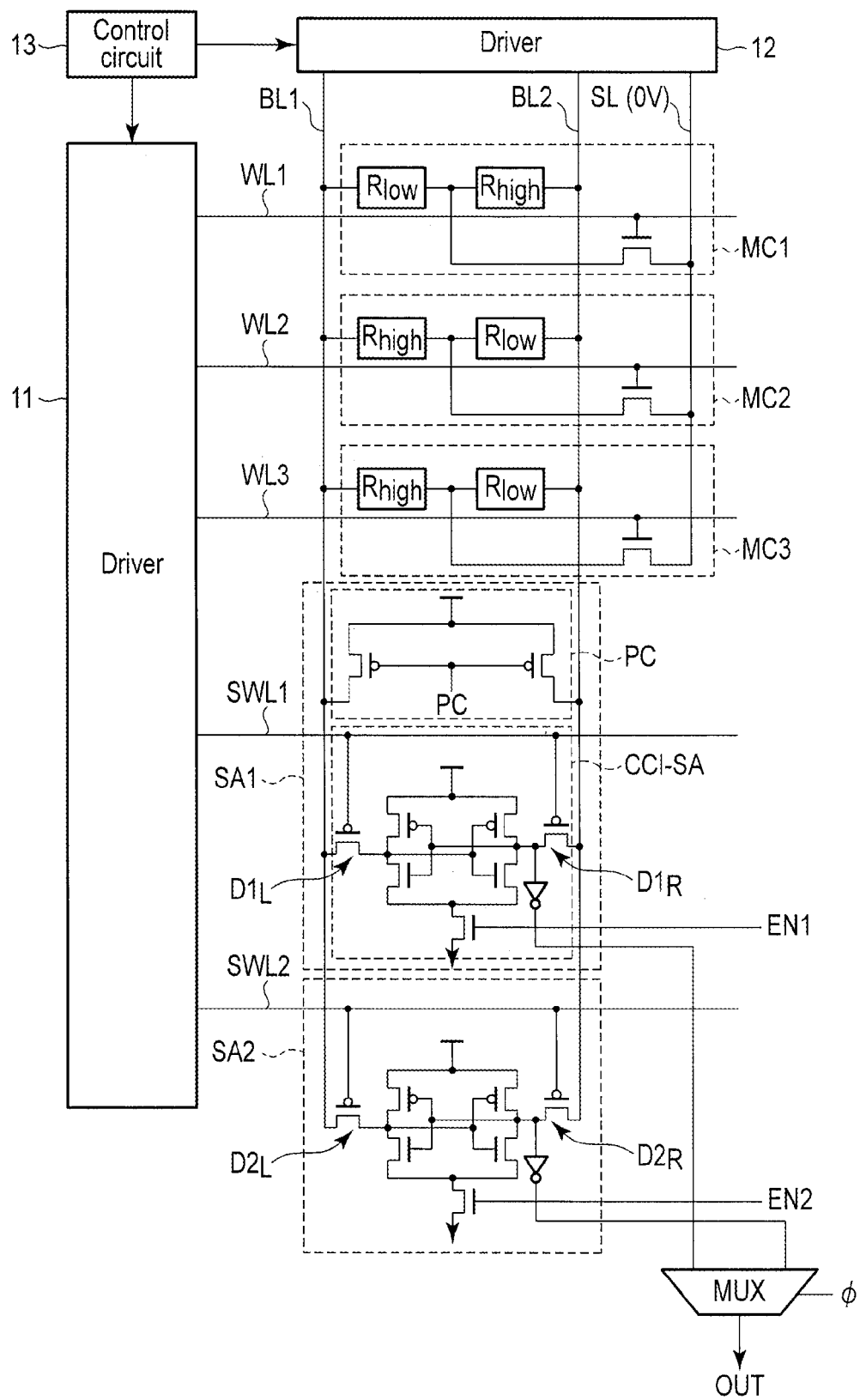
F I G. 3

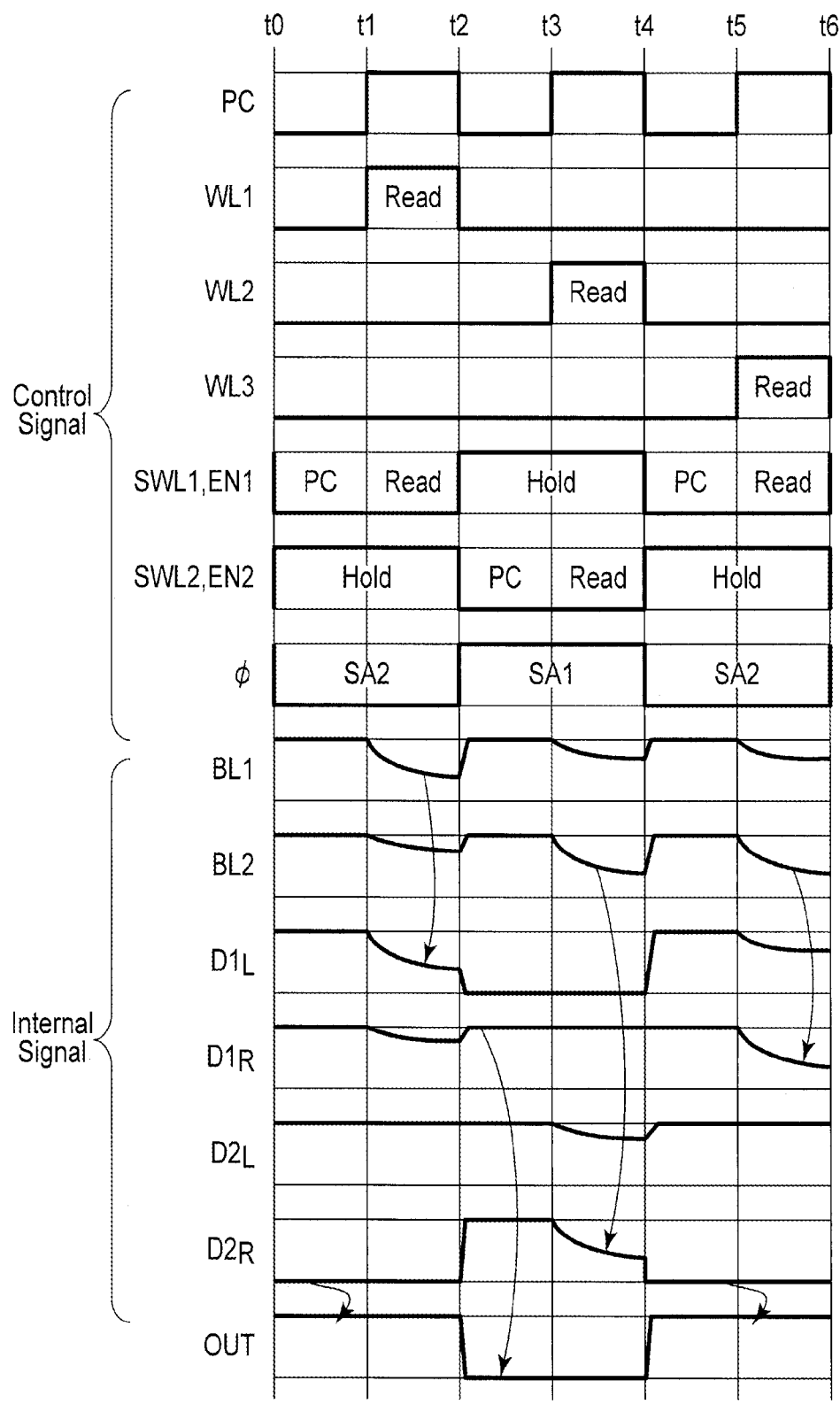
F I G. 4

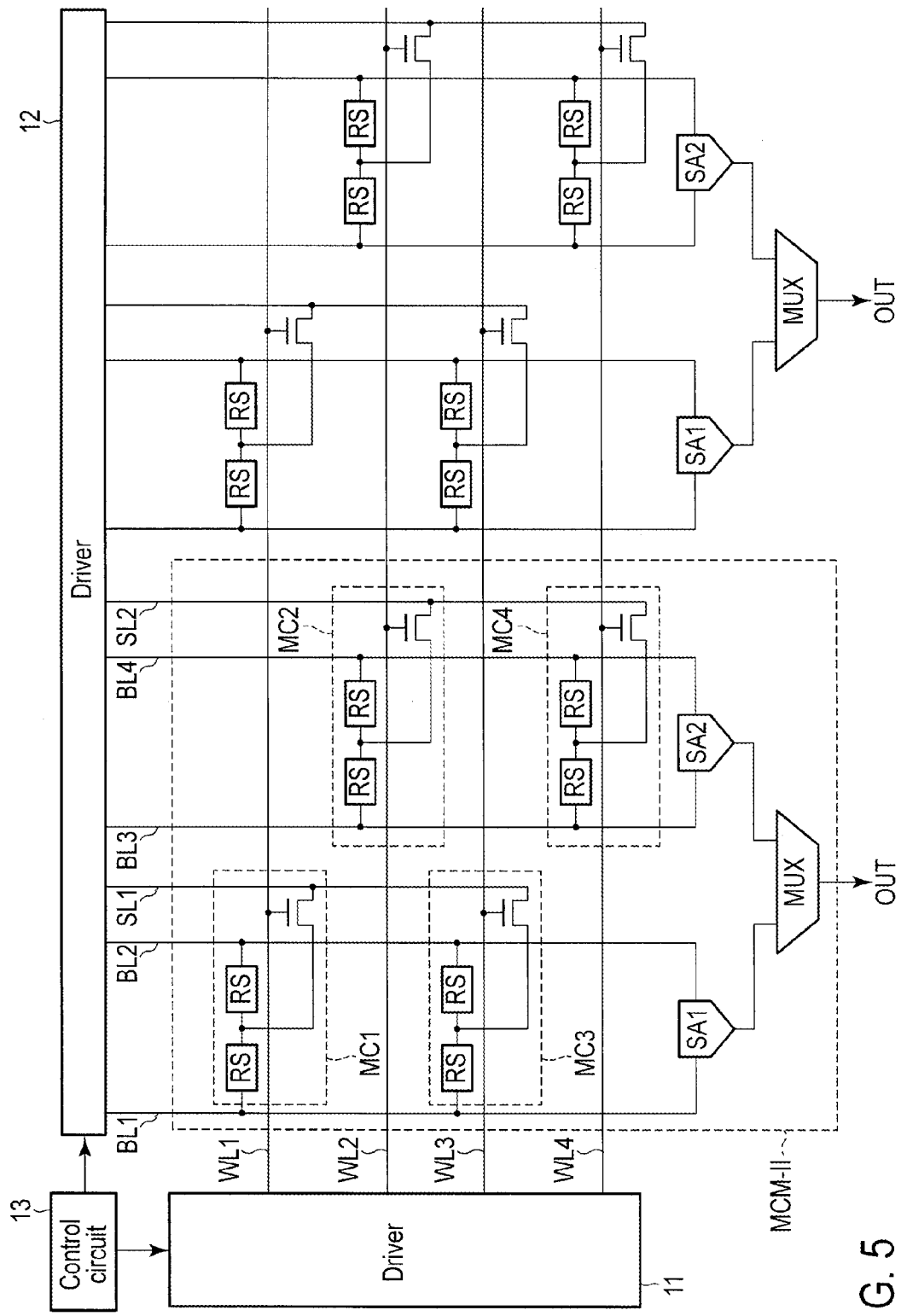
F I G. 5

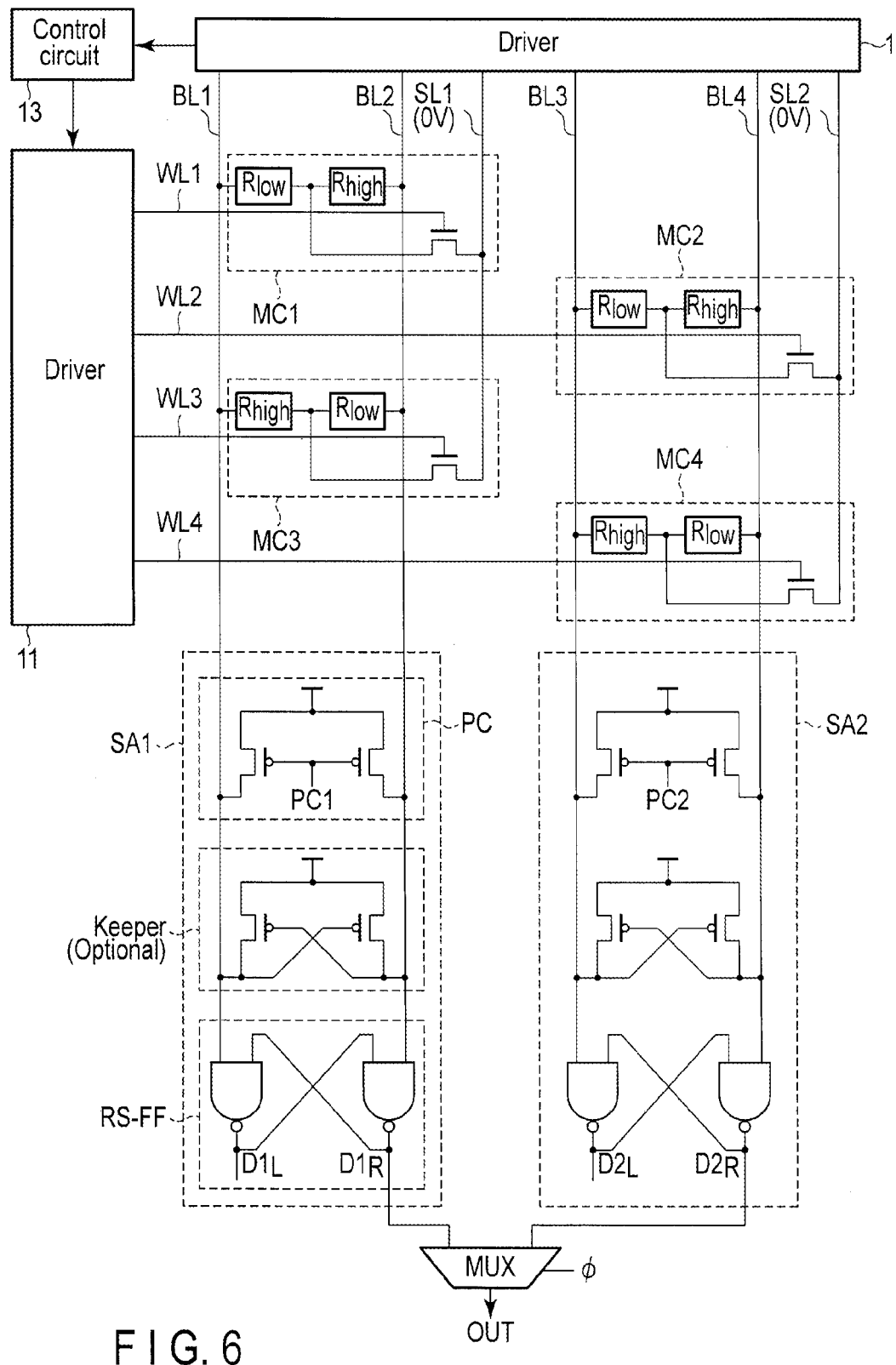
F I G. 6

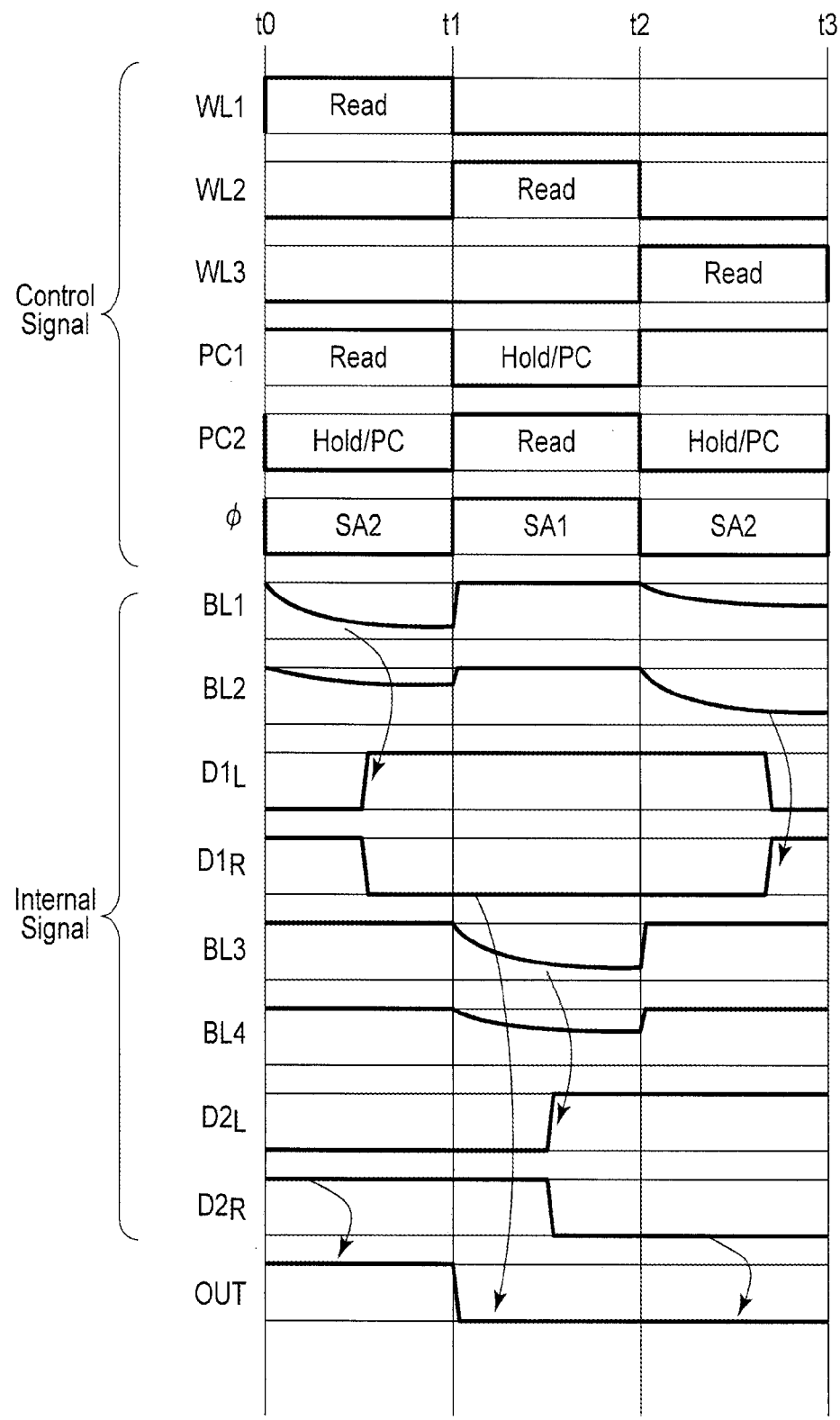
F I G. 8

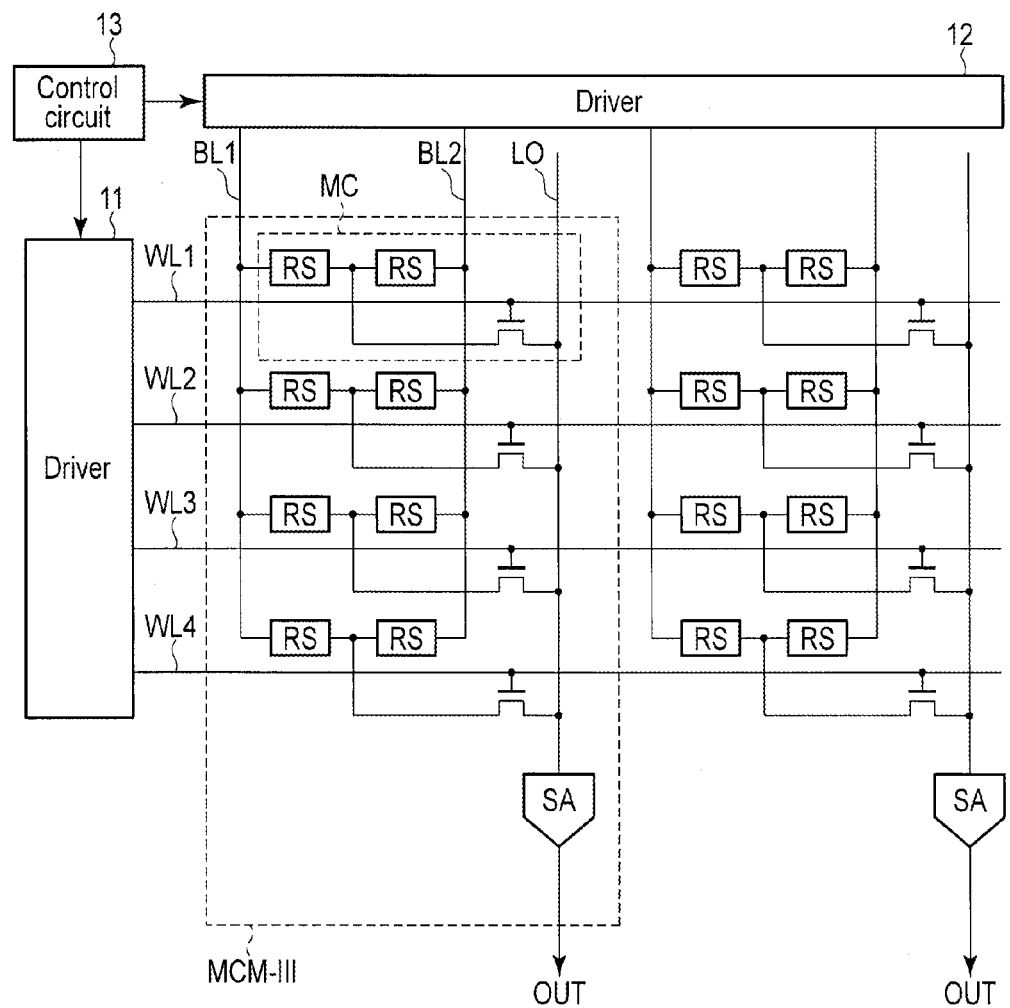
F I G. 9

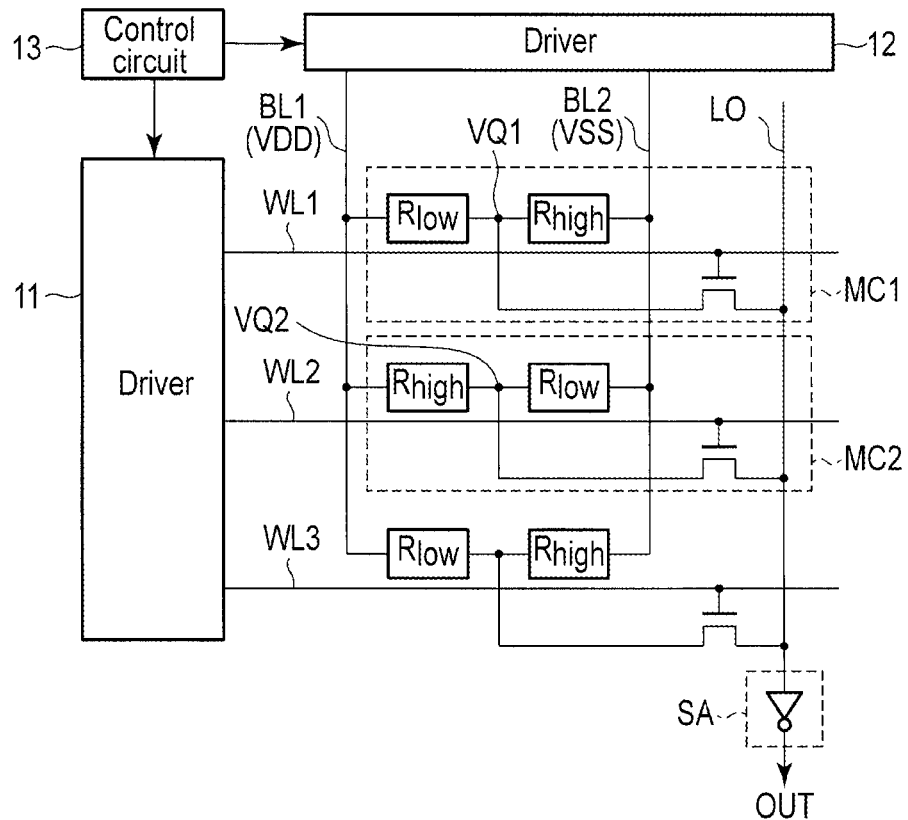
F I G. 10
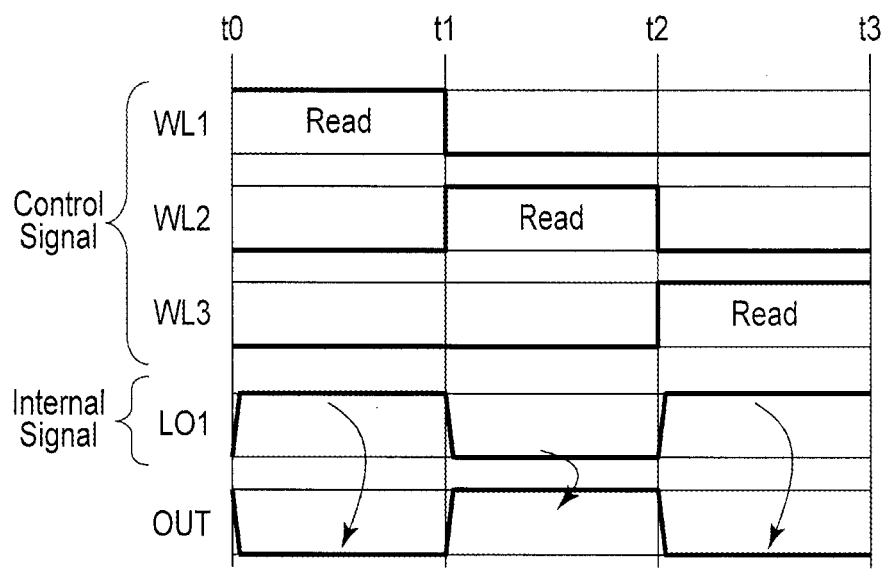
F I G. 11

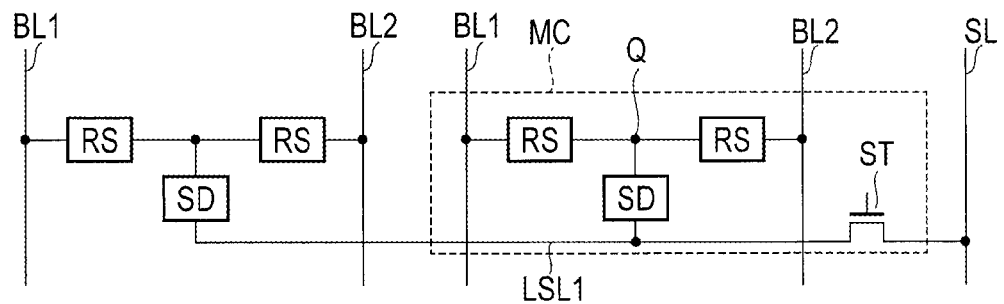
F I G. 16
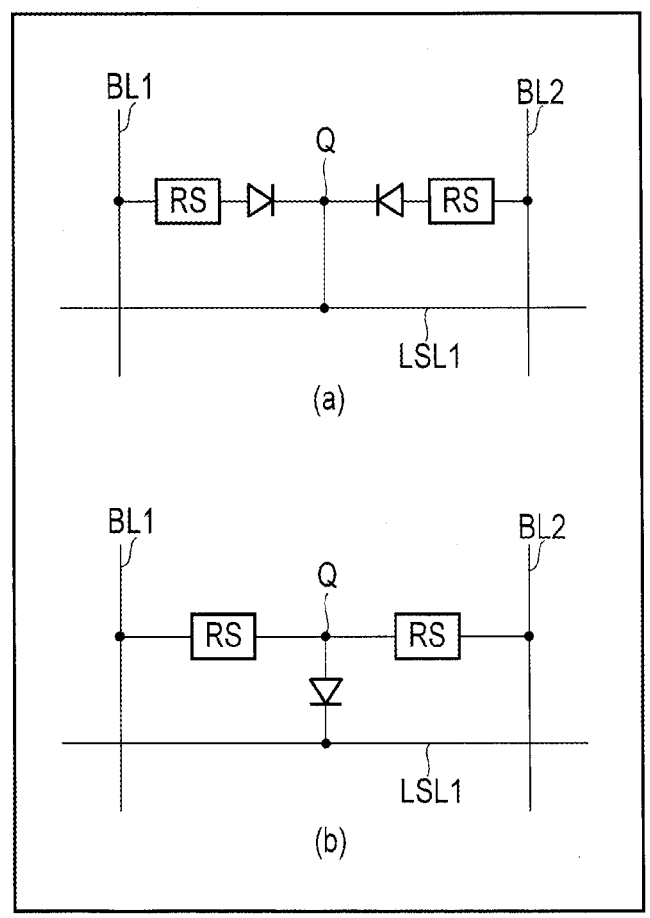
F I G. 17

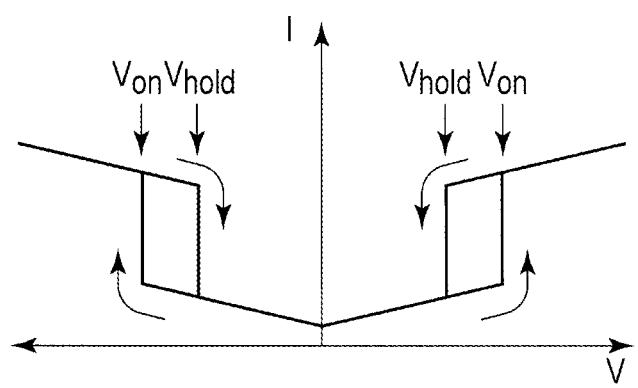
F I G. 18

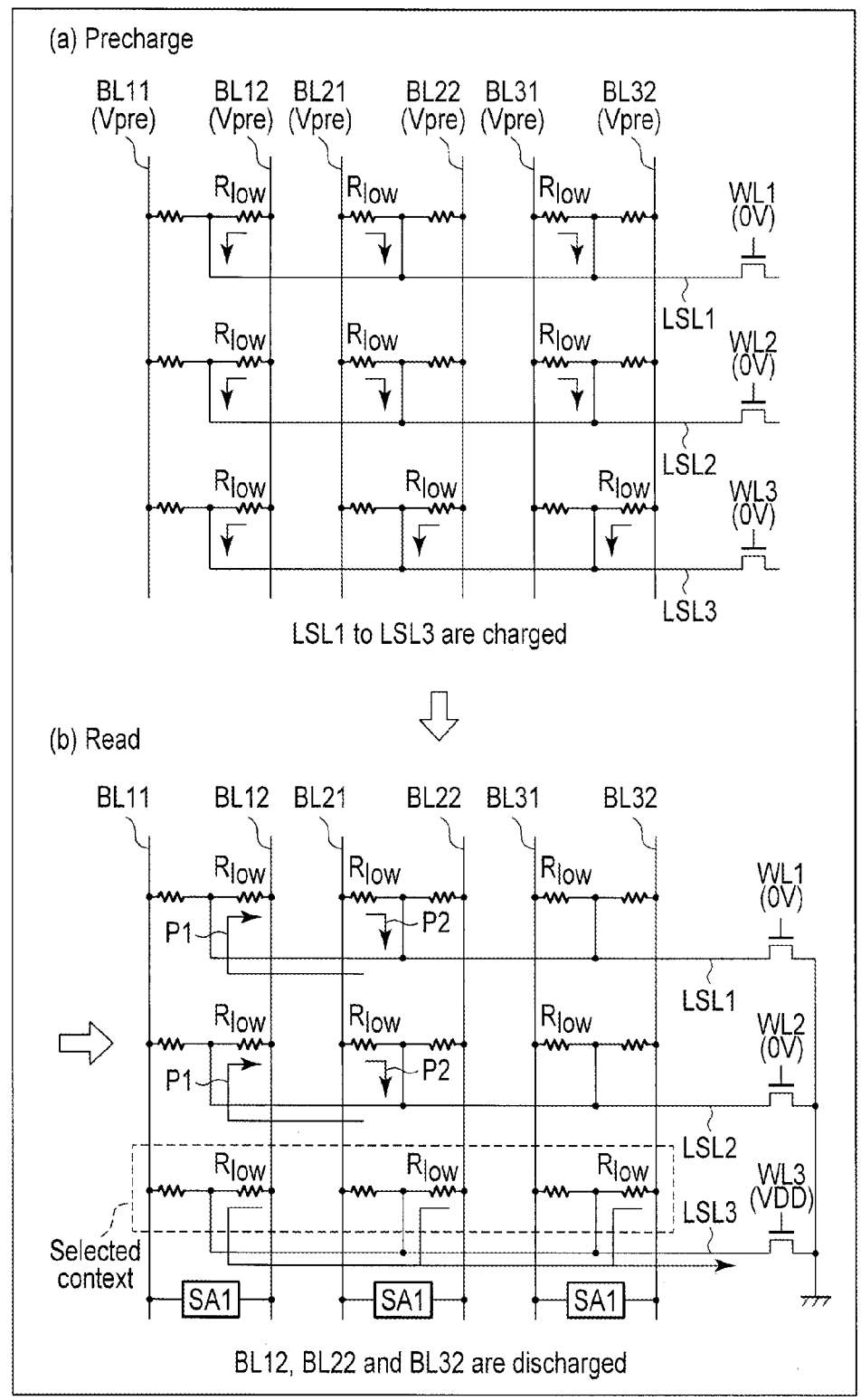
F I G. 19

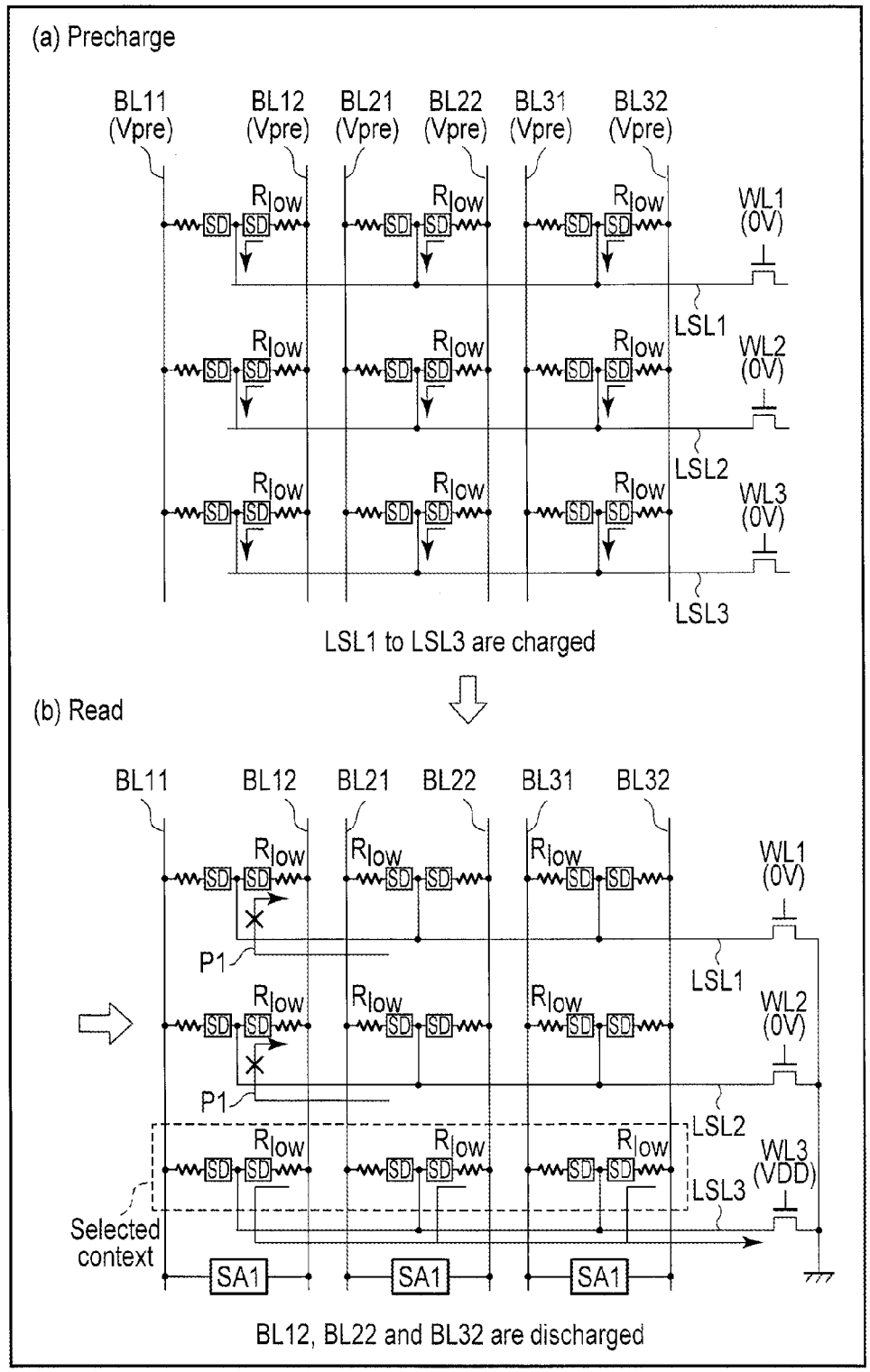
F I G. 20

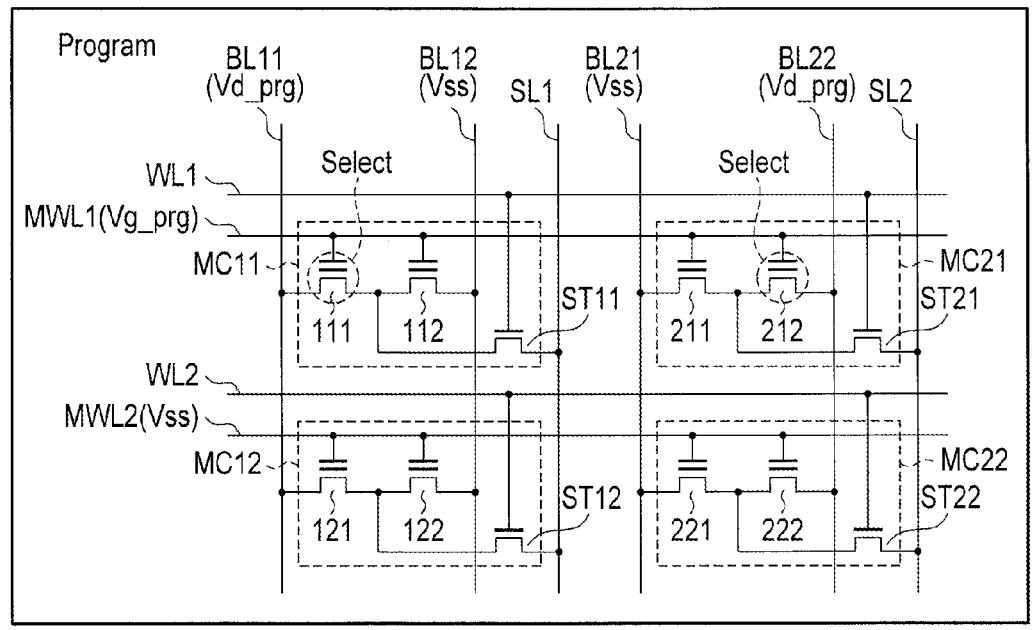
F I G. 23
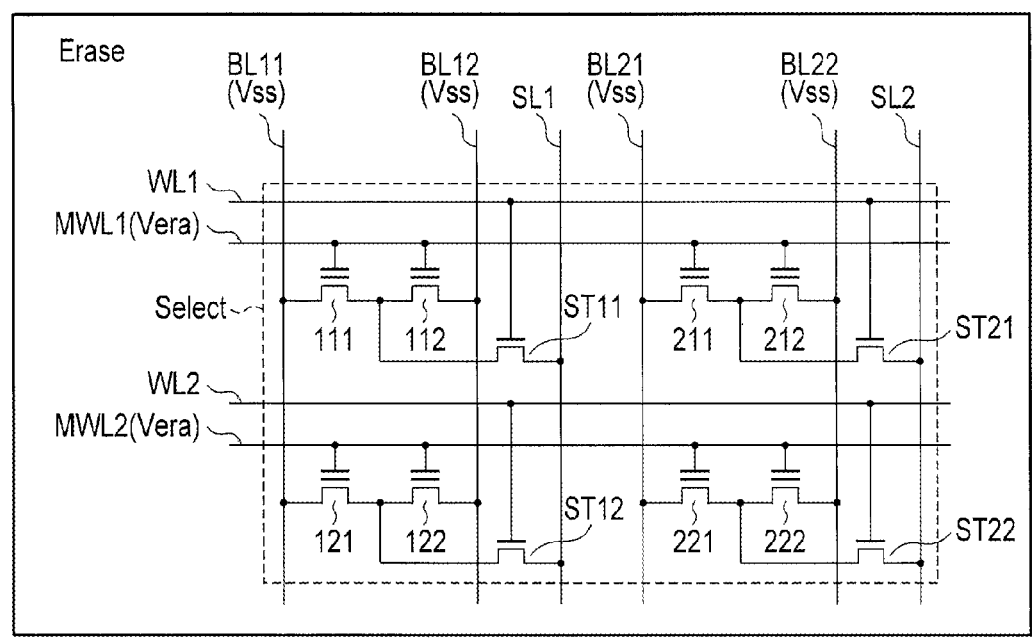
F I G. 24

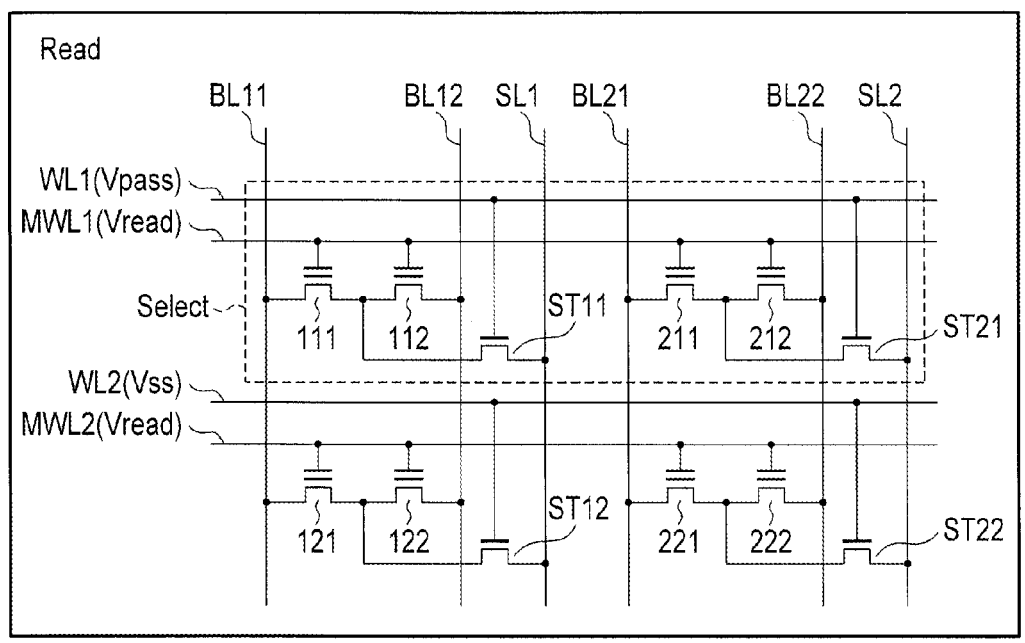
F I G. 25

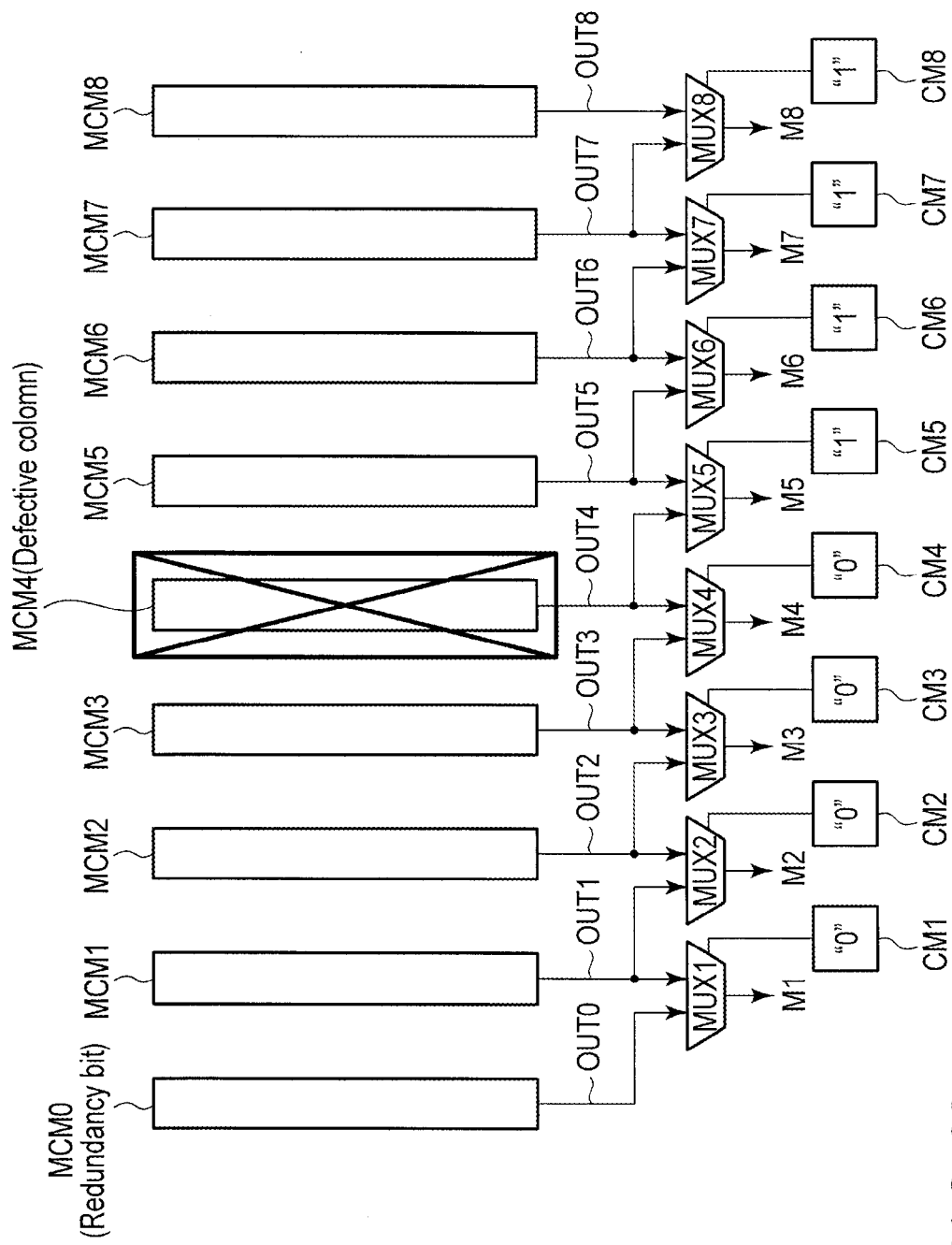
F I G. 26

MULTI-CONTEXT CONFIGURATION MEMORY

CROSS REFERENCE TO RELATED APPLICATIONS

This application is a Continuation Application of PCT Application No. PCT/JP2014/069798, filed Jul. 28, 2014 and based upon and claiming the benefit of priority from Japanese Patent Application No. 2013-155993, filed Jul. 26, 2013, the entire contents of all of which are incorporated herein by reference.

FIELD

Embodiments described herein relate generally to multi-context configuration memories.

BACKGROUND

A reconfigurable logic circuit that is represented by a field programmable gate array (FPGA) realizes a predetermined logic (circuit configuration) based on data stored in a configuration memory.

A multi-context configuration memory (MCM) includes a plurality of memory cells and one output terminal and outputs data stored in one of a plurality of memory cells from the output terminal. A reconfigurable logic circuit including the MCM had been called a multi-context device for a short period, stores a plurality of pieces of circuit configuration information, and can change the circuit configuration according to a context switching signal. In the multi-context device, as the number of storable contexts is increased, the use efficiency of a logic circuit unit increases.

An MCM in which a memory cell is configured by using a static random access memory (SRAM) has been known. The SRAM is configured by six transistors and has a relatively large cell area. Since the area of the MCM unit sharply increases according to an increase in the number of contexts, it is difficult to increase the number of contexts. In addition, since the SRAM is volatile, data stored in the configuration memory disappears at time of the power interruption. For this reason, a technology for shutting off power at a standby time for implementing low power consumption cannot be applied.

Thus, a technology relating to an MCM configured by a memory cell that has a small cell area and is non-volatile has been requested.

BRIEF DESCRIPTION OF THE DRAWINGS

FIG. 3 is a diagram that illustrates an example of sense amplifiers of the MCM-I.
FIG. 4 is a diagram that illustrates an operation waveform of the circuit illustrated in FIG. 3.
FIG. 5 is a diagram that illustrates the configuration of an MCM-II.
FIG. 6 is a diagram that illustrates an example of a sense amplifier of the MCM-II.
FIG. 8 is a diagram that illustrates an operation waveform of the circuit illustrated in FIG. 6.
FIG. 9 is a diagram that illustrates the configuration of an MCM-III.
FIG. 10 is a diagram that illustrates an example of a sense amplifier of the MCM-III.
FIG. 11 is a diagram that illustrates an operation waveform of the circuit illustrated in FIG. 10.
FIG. 16 is a diagram that illustrates a modified example of a memory cell.
FIG. 17 is a diagram that illustrates examples of the configuration of a memory cell.
FIG. 18 is a diagram that illustrates a voltage-current characteristic of a threshold switch device.
FIG. 19 is a diagram that illustrates an occurrence of a read disturbance.
FIG. 20 is a diagram that illustrates the prevention of the read disturbance.
FIG. 23 is a diagram that illustrates a write operation performed by a three-terminal device.
FIG. 24 is a diagram that illustrates an erase operation of a three-terminal device.
FIG. 25 is a diagram that illustrates a read operation performed by a three-terminal device.
FIG. 26 is a diagram that illustrates a redundancy bit.

DETAILED DESCRIPTION

In general, according to one embodiment, an integrated circuit comprises: first and second data lines; a first memory cell comprising first and second resistance changing elements connected in series between the first and second data lines and a first selection transistor including a drain connected to a connection node of the first and second resistance changing elements; a second memory cell comprising third and fourth resistance changing elements connected in series between the first and second data lines and a second selection transistor including a drain connected to a connection node of the third and fourth resistance changing elements; a first sense amplifier comprising first input terminals and a first output terminal, the first input terminals connected to the first and second data lines; a switching transistor including a control terminal, a first signal terminal and a second signal terminal, the control terminal receiving a control signal output from the output terminal of the first sense amplifiers; a first logic circuit connected to the first signal terminal; a second logic circuit connected to the second signal terminal; and a control circuit controlling programming or reading for the first or second memory cell.

Hereinafter, embodiments will be described with reference to the drawings.

First Embodiment

Figure 1:
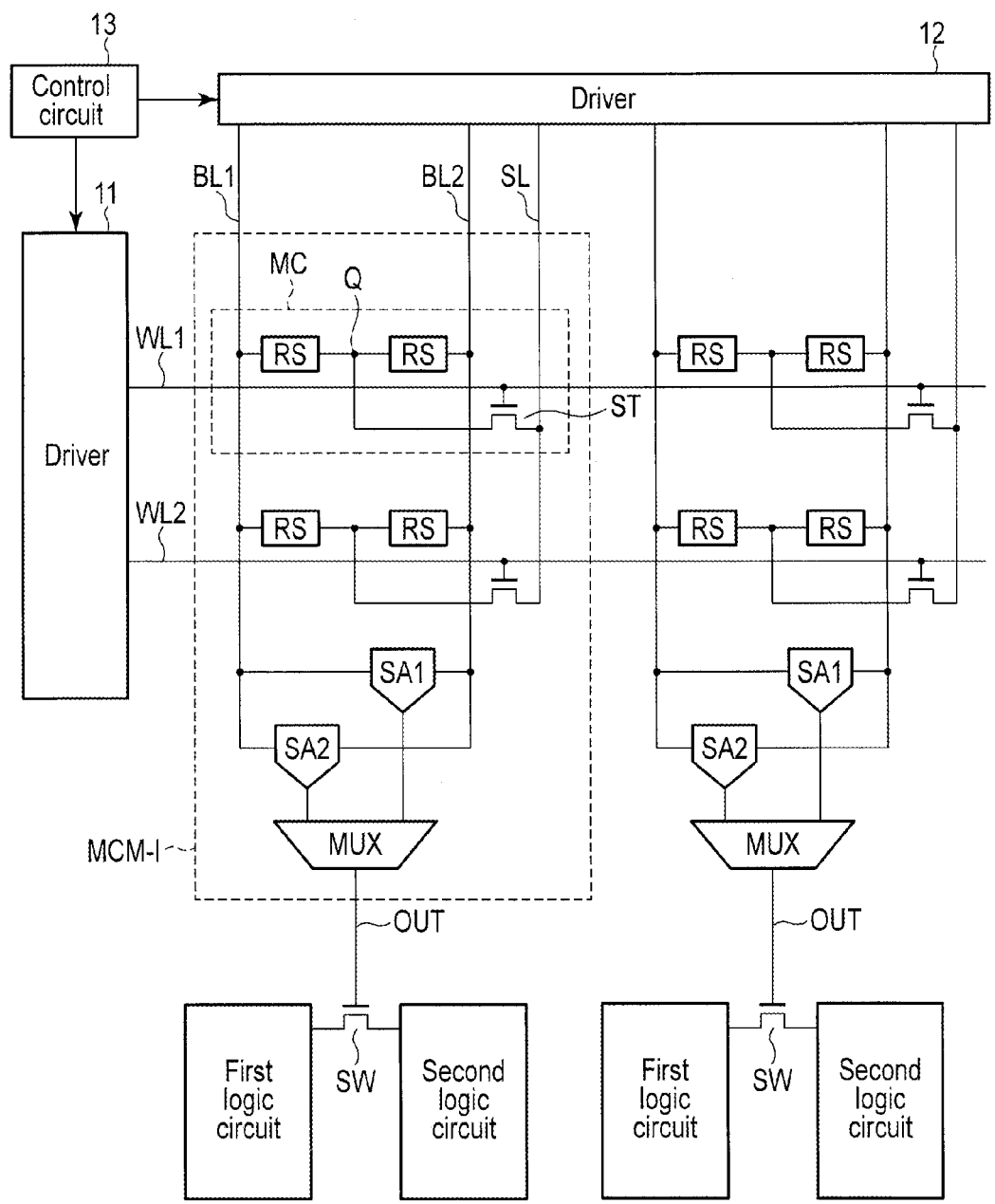
FIG. 1 is a diagram that illustrates the configuration of an MCM-I.

FIG. 1 is a circuit diagram of a multi-context configuration memory (MCM-I) according to a first embodiment.

The MCM-I includes a plurality of memory cells (MCs) connected between first and second bit lines (BL1 and BL2), and two sense amplifiers (SA1 and SA2). The memory cells store respective configuration data of one bit and are connected to different word lines (WL1 and WL2). The word lines (WL1 and WL2) are connected to a driver 11. Each sense amplifier includes one output terminal, reads data stored by the memory cell selected by the word line, and thereafter stores and simultaneously outputs the data continuously from the output terminal. The MCM-I further includes a two-input/one-output multiplexer (MUX). The output terminals of the two sense amplifiers are connected to the input terminal of the multiplexer, and the output terminal of the multiplexer serves as a configuration data output terminal (OUT) of the MCM-I.

In a reconfigurable logic circuit, the configuration data output terminal (OUT), for example, is connected to a control terminal (for example, a gate terminal of an (FET) of a pass transistor. The pass transistor has a role of selectively connecting logic elements used for realizing a predetermined logic (circuit configuration). In addition, there are cases where one output node (OUT) is connected to gate terminals of a plurality of pass transistors.

As illustrated in FIG. 1, a plurality of MCM-I's arranged in the row direction can share the word lines (WL1 and WL2).

The memory cell (MC) includes first and second resistance changing elements (RS) that are connected in series between the first and second bit lines (BL1 and BL2), and a selection transistor (ST) having a drain connected to a connection node (Q) disposed between the first and second resistance changing elements.

The first and second bit lines (BL1 and BL2) and a source line (SL) are connected to a driver 12.

A control circuit 13 controls the drivers 11 and 12, thereby controlling the electric potentials of the word lines (WL1 and WL2), the first and second bit lines (BL1 and BL2), and the source line (SL).

For example, when data "0" is programmed in the memory cell, the control circuit 13 performs control of the drivers 11 and 12 such that the resistance of the first resistance changing element is lower than that of the second resistance changing element. On the other hand, when data "1" is programmed in the memory cell, the control circuit 13 performs control of the drivers 11 and 12 such that the resistance of the first resistance changing element is higher than that of the second resistance changing element. In other words, the control circuit 13 programs the relative magnitudes of the resistance values of the two resistance changing elements in a complementary manner, whereby the memory cell records data of one bit.

The sources of a plurality of selection transistors disposed inside a plurality of memory cells are connected to the source line (SL).

A switching transistor (SW) includes a control terminal, a first signal terminal and a second signal terminal. The control terminal of the switching transistor (SW) receives a control signal from one of the first and second sense amplifiers (SA1, SA2). A first logic circuit is connected to the first signal terminal of the switching transistor (SW). A second logic circuit is connected to the second signal terminal of the switching transistor (SW).

Figure 2:
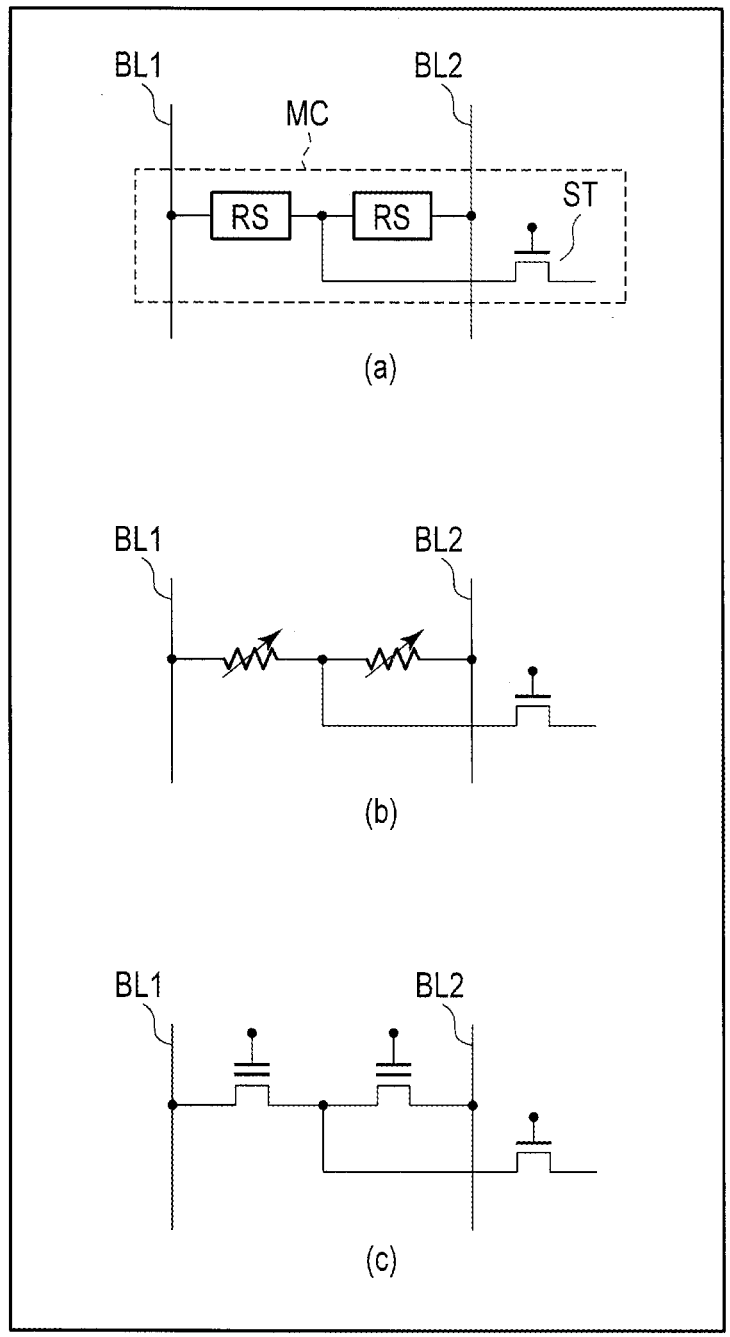
FIG. 2 is a diagram that illustrates examples of the configuration of a memory cell.

FIG. 2 illustrates examples of the configuration of the memory cell.

FIG. 2(a) illustrates one extracted memory cell (MC) illustrated in FIG. 1.

FIG. 2(b) illustrates an embodiment in which each of both the first and second resistance changing elements disposed inside the memory cell is a non-volatile resistance changing element having two terminals. As the non-volatile resistance changing element having two terminals, for example, a ReRAM (Resistive switching random access memory) may be used.

In addition, as the non-volatile resistance changing element having two terminals, a phase change memory (PCM), a magnetoresistive random access memory (MRAM), or the like may be used. Furthermore, as the non-volatile resistance changing element having two terminals, a memory device (one-time-programmable memory: OTP) of one-time writing that is based on an irreversible destruction phenomenon such as a fuse, an anti-fuse, a metal-insulator-metal (MIM)-type capacitor, or a metal-insulator-semiconductor (MIS)-type capacitor may be used. As the fuse device, a contact fuse may be used which is a fuse device based on a phenomenon of destruction of a contact between a via wiring and silicide of a case where the density of a write current exceeds a threshold.

Since the non-volatile resistance changing element having two terminals can be formed not on the surface of a Si substrate but inside a wiring layer, there is an advantage that an effective occupant area on the surface of the Si substrate can be decreased. For example, the occupant area of a memory cell including two two-terminal non-volatile resistance changing elements and one selection transistor on the surface of the Si substrate can be decreased to be less than that of an SRAM cell including six transistors.

FIG. 2(c) illustrates an embodiment in which both first and second resistance changing elements disposed inside a memory cell are non-volatile resistance changing elements each having three terminals.

As the non-volatile resistance changing element having three terminals, for example, a non-volatile memory transistor of a floating-gate (FG) type or a metal-oxide-nitride-oxide-silicon (MONOS) type may be used.

When the memory cell stores data "0", a threshold voltage of a first non-volatile memory transistor is set to a low value (Vth_low), and a threshold voltage of a second non-volatile memory transistor is set to a high value (Vth_high). On the other hand, when the memory cell stores data "1", the threshold voltage of the first non-volatile memory transistor is set to a high value (Vth_high), and the threshold voltage of the second non-volatile memory transistor is set to a low value (Vth_low).

When data is to be read, a read voltage (Vread) that is a voltage between the values Vth_low and Vth_high is applied to the gates of the first and second non-volatile memory transistors. As a result, when the memory cell stores data "0", the channel resistance of the first non-volatile memory transistor is lower than that of the second non-volatile memory transistor. On the other hand, when the memory cell stores data "1", the channel resistance of the first non-volatile memory transistor is higher than that of the second non-volatile memory transistor.

As above, the same function can be realized in a case where the two-terminal devices as illustrated in FIG. 2(b) are used and a case where three-terminal devices as illustrated in FIG. 2(c) are used.

As the non-volatile resistance changing element having three terminals, a metal-oxide-silicon field effect transistor (MOSFET) can be used.

A threshold voltage (Vth) of the MOSFET is changed by using a channel hot electron (CHE) injection method used for a NOR-type flash memory. By applying the CHE injection method to an n-type MOSFET, some of CHEs are captured within a gate insulating film, and the threshold voltage (Vth) rises.

When the memory cell stores data "0", the threshold of the second MOSFET is set to a high value (Vth_high) by using the CHE injection method. On the other hand, when the memory cell stores data "1", the threshold of the first MOSFET is set to a high value (Vth_high).

When data is to be read, a read voltage (Vread) that is a voltage between the original threshold (Vth) of the MOSFET and the value Vth_high is applied to gates of the first and second MOSFETs. As a result, when the memory cell stores data "0", the channel resistance of the first MOSFET is lower than that of the second MOSFET. On the other hand, when the memory cell stores data "1", the channel resistance of the first MOSFET is higher than that of the second MOSFET.

Also in a case where the following selective destruction technique is used, the MOSFET can be used as the non-volatile resistance changing element having three terminals.

When high negative electric potential is applied to the gate after the body of the MOSFET is set to be in a floating state, in other words, after the source/drain of the MOSFET are set to ground electric potential, the junction between the source and the drain is irreversibly destroyed, and the source and the drain form a short circuit. In addition, this selective destruction technique may be used also to non-volatile memory transistors of the FG type and the MONOS type.

By using this selective destruction technique, when the memory cell is to store data "0", the source and the drain of the first MOSFET are made to irreversibly form a short circuit, and, when the memory cell is to store data "1", the source and the drain of the second MOSFET are made to irreversibly form a short circuit.

When data is to be read, an off electric potential (Voff) that is lower than the threshold voltage of the MOSFET is applied to the gates of the first and second MOSFETs. As a result, when the memory cell stores data "0", the channel resistance of the first MOSFET is lower than that of the second MOSFET. On the other hand, when the memory cell stores data "1", the channel resistance of the first MOSFET is higher than that of the second MOSFET.

The occupant area of a memory cell including two non-volatile resistance changing elements each having three terminals and one selection transistor on the surface of the Si substrate can be configured to be smaller than that of an SRAM cell including six transistors.

FIG. 3 illustrates an example of the configuration of the first and second sense amplifiers (SA1 and SA2) of the MCM-I illustrated in FIG. 1.

In the figure, the same reference numeral is assigned to each same element as that illustrated in FIG. 1, and detailed description thereof will not be presented.

The SA1 includes a cross-coupled inverter (CCI)-type sense amplifier circuit (CCI-SA), and a precharge circuit (PC). The precharge circuit includes p-channel FETs connected between the power supply line and both the bit lines (BL1 and BL2).

The CCI-type sense amplifier circuit includes first and second data terminals ($D1_L$ and $D1_R$), and a cross-coupled inverter is connected therebetween. Two n-channel FETs of the cross-coupled inverter are connected to a ground line through n-channel FETs having the gates connected to sense enable signals (EN1/EN2).

The first and second data terminals ($D1_L$ and $D1_R$) are respectively connected to the first and second bit lines (BL1 and BL2) through transfer gates of the p-channel FETs.

Here, in order to improve the sensitivity of the sense amplifier circuit, it is preferable that the transfer gate is a p-channel FET rather than an n-channel FET.

The reason for this is that, when the transfer gate is configured as a p-channel FET, in a precharge phase, high electric potential of the bit line can be transferred to a data terminal without incurring a voltage drop.

The second data terminal ($D1_R$) is connected to a first output terminal through an output inverter.

Here, while an output terminal is not connected to the first data terminal ($D1_L$), instead of this, the first data terminal ($D1_L$) may be connected to a second output terminal through an output inverter. In such a case, data acquired by inverting data that is acquired from the first output terminal can be acquired from the second output terminal.

The SA2, similar to the SA1, includes a CCI-type sense amplifier (CCI-SA) and a precharge circuit (PC). In this example, the SA1 and SA2 share one precharge circuit.

The switching transistor, the first logic circuit and the second logic circuit in FIG. 1 may have applicability to the embodiment shown in FIG. 3.

FIG. 4 illustrates an operation waveform diagram of the circuit (MCM-I) illustrated in FIG. 3.

In the figure, an operation corresponding to three cycles is illustrated.

In a first cycle (t0 to t2), the MCM-I outputs data stored in the SA2 and, simultaneously, reads the data of the memory cell 1 (MC1) by using the SA1. In a second cycle (t2 to t4), the MCM-I outputs data of the MC1 stored in the SA1 and simultaneously, reads the data of the memory cell 2 (MC2) by using the SA2. In a third cycle (t4 to t6), the MCM-I outputs the data of the MC2 stored in the SA2 and, simultaneously, reads the data of the memory cell (MC3) by using the SA1.

In this way, the MCM-I can output the data of a different memory cell for each cycle.

The operation of the MCM-I, for example, for the first and second cycles (t0 to t4) will be described in detail.

When the MCM-I is operated, a SL is constantly stored at ground electric potential (0 V).

For the first cycle (t0 to t2), the SA1 reads data of a memory cell 1 (MC1) that is a selected memory cell. For the first cycle, a sense amplifier selection word line (SWL1) of the SA1 is at a "L" level, the transfer gate (p-channel FET) of the SA1 is turned on, and the bit line and the data terminal of the SA1 are connected to each other. In addition, an EN line (EN1) of the SA1 is at the "L" level, and the SA1 is inactivated.

A first half (t0 to t1) of the first cycle is a precharge phase. All the word lines (WL1 to WL3) are at the "L" level, and all the selection transistors disposed inside all the memory cells (MC1 to MC3) are in the off state. As a result, the source line and the bit line are disconnected from each other.

On the other hand, a precharge signal (PC) is at the "L" level, and the p-channel FET disposed inside the precharge circuit is turned on, and the bit line and the power supply line are connected to each other. As a result, the bit line is precharged to an "H" level. In addition, the first and second data terminals ($D1_L$ and $D1_R$) of the SA1 are also precharged to the "H" level through the transfer gate.

A second half (t1 to t2) of the first cycle is a read phase. The precharge signal (PC) becomes the "H" level, and the bit line and the power supply line are disconnected from each other. On the other hand, the word line (WL1) corresponding to the memory cell 1 (MC1) becomes the "H" level, and a Q node of the MC1 is connected to the source line (SL).

Here, the memory cell MC1 stores data "0". In other words, the resistance of the first resistance changing element is lower than that of the second resistance changing element. The electric charges accumulated in the bit line (BL1) and the bit line (BL2) are discharged to the source line (SL) respectively through the first and second resistance changing elements. Since the resistance of the first resistance changing element is lower than that of the second resistance changing element, the electric potential of the BL1 decreases in a relatively speedy manner. As a result, the electric potential of the first data terminal ($D1_L$) is lower than that of the second data terminal ($D1_R$).

For the second cycle (t2 to t4), the SA1 stores and outputs the data of the MC1.

At the start (t2) of the second cycle, the sense amplifier selection word line (SWL1) becomes the "H" level, and the bit line and the data terminal of the SA1 are disconnected from each other. In addition, since the EN1 changes from the "L" level to the "H" level, the SA1 is activated. As a result, the electric potential of the first data terminal ($D1_L$) is fixed to the "L" level in a speedy manner, and simultaneously, the electric potential of the second data terminal ($D1_R$) is fixed to the "H" level.

Thereafter, over the second cycle (t2 to t4), the SA1 stores the data of the MC1, and simultaneously, the stored data is output from a first output node. For the second cycle, a multiplexer (MUX) outputs the data supplied from the SA1 as an output (OUT).

At a time point when the SA1 is active, there may be a difference between the electric potential of the first data terminal ($D1_L$) and the electric potential of the second data terminal ($D1_R$), and it is not necessary for the first data terminal ($D1_L$) to arrive at specific electric potential or less or for the second data terminal ($D1_R$) to stay at specific electric potential or more.

Thus, even in a case where the resistance ($R_{LRS}$) of the resistance changing element that is in a low resistance state (LRS) is relatively high, high-speed reading can be performed. In addition, even in a case where the resistance ($R_{HRS}$) of the resistance changing element that is in a high resistance state (HRS) is relatively low, erroneous reading does not occur. In this way, according to the MCM-I of this example, a resistance changing element having the $R_{HRS}$ and $R_{LRS}$ of a wide range can be employed.

Meanwhile, for the first cycle (t0 to t2), the SA2 stores and outputs the internal data. Over the first cycle, the word line SWL2 is at the "H" level, and the bit line and the data terminal of the SA2 are disconnected from each other. Thus, even when the electric potential of the bit line changes according to the reading of the memory cell MC1 that is performed by the SA1, the data terminal of the SA2 is not influenced thereby.

For the second cycle (t2 to t4), the SA2 reads the data of the memory cell 2 (MC2) that is the selection memory cell by performing the same operation as that of the SA1 performed within the first cycle. Over the second cycle, the SWL1 is at the "H" level, and the bit line and the data terminal of the SA1 are disconnected from each other. Thus, even when the electric potential of the bit line changes according to the reading of the memory cell (MC2) that is performed by the SA2, the data terminal of the SA1 is not influenced thereby.

Second Embodiment

FIG. 5 illustrates the circuit diagram of a multi-context configuration memory (MCM-II) according to a second embodiment.

The MCM-II includes a first column that includes a plurality of memory cells (MC1 and MC3) connected between first and second bit lines (BL1 and BL2) and one sense amplifier (SA1), and a second column that includes a plurality of memory cells (MC2 and MC4) connected between third and fourth bit lines (BL3 and BL4) and one sense amplifier (SA2).

The first to fourth bit lines (BL1, BL2, BL3, and BL4) and source lines (SL1 and SL2) are connected to a driver 12.

The memory cells store respective configuration data of one bit and are connected to different word lines (WL1 to WL4). The word lines (WL1 to WL4) are connected to a driver 11. The control circuit 13 controls the drivers 11 and 12, thereby controlling the electric potentials of the word lines (WL1 to WL4), the first to fourth bit lines (BL1, BL2, BL3, and BL4) and the source lines (SL1 and SL2). Each of the sense amplifiers (SA1 and SA2) includes one output terminal, reads data stored by a memory cell selected by a word line, and thereafter stores the data and simultaneously, continuously outputs the data from the output terminal.

The MCM-II includes a two-input/one-output multiplexer (MUX). The output terminals of the two sense amplifiers (SA1 and SA2) are connected to the input terminal of the multiplexer (MUX), and the output terminal of the multiplexer (MUX) serves as a configuration data output terminal (OUT) of the MCM-II.

As illustrated in FIG. 5, a plurality of MCM-II's arranged in the row direction can share the word lines (WL1 to WL4).

As each of the memory cells (MC1 to MC4), a memory cell similar to that of the first embodiment may be used. Sources of selection transistors of these memory cells are connected to the source lines (SL1 and SL2).

The switching transistor, the first logic circuit and the second logic circuit in FIG. 1 may have applicability to the embodiment shown in FIG. 5.

FIG. 6 illustrates an example of the configuration of the first and second sense amplifiers (SA1 and SA2) of the MCM-II illustrated in FIG. 5.

In the figure, the same reference numeral is assigned to each same element as that illustrated in FIG. 5, and detailed description thereof will not be presented.

The SA1 includes an RS flip-flop circuit (RS-FF) and a precharge circuit (PC).

Figure 7:
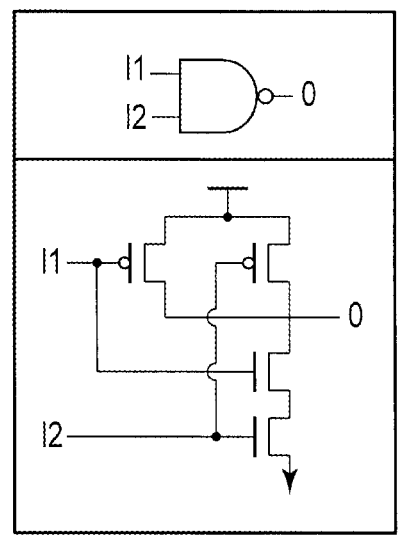
FIG. 7 is a diagram that illustrates an example of the configuration of an NAND gate.

In the first sense amplifier (SA1), the precharge circuit includes p-channel FETs connected between a power supply line and both the bit lines (BL1 and BL2). The RS-FF includes two two-input NAND gates. FIG. 7 illustrates an example of the configuration of the NAND gate. In the RS-FF, an output terminal of one NAND gate is connected to an input terminal of the other NAND gate (cross-coupled NAND). Output terminals of the NAND gates are connected to first and second data terminals ($D1_L$ and $D1_R$). One of the two input terminals of the NAND gate is connected to one of the BL1 and BL2. The second data terminal ($D1_R$) is connected to a first output terminal.

The SA2 has the same configuration as the SA1. An RS flip-flop circuit (RS-FF) of the SA2 includes third and fourth data terminals ($D2_L$, and $D2_R$), and the fourth data terminal ($D2_R$) is connected to a second output terminal.

The switching transistor, the first logic circuit and the second logic circuit in FIG. 1 may have applicability to the embodiment shown in FIG. 6.

FIG. 8 illustrates an operation waveform diagram of the circuit (MCM-II) illustrated in FIG. 6.

In the figure, an operation corresponding to three cycles is illustrated.

In a first cycle (t0 to t1), the MCM-II outputs data stored in the SA2 and, simultaneously, reads the data of the memory cell 1 (MC1) by using the SA1. In a second cycle (t1 to t2), the MCM-II outputs data of the MC1 stored in the SA1 and simultaneously, reads the data of the memory cell 2 (MC2) by using the SA2. In a third cycle (t2 to t3), the MCM-II outputs the data of the MC2 stored in the SA2 and, simultaneously, reads the data of the memory cell (MC3) by using the SA1.

In this way, the MCM-II can output the data of a different memory cell for each cycle.

The operation of the MCM-II, for example, for the first and second cycles (t0 to t2) will be described in detail.

When the MCM-II is operated, a source line (SL) is constantly stored at ground electric potential (0 V).

For the first cycle (t0 to t1), the SA1 reads data of a memory cell 1 (MC1) that is a selected memory cell. In a cycle before the first cycle, both the bit lines are precharged to the "H" level in advance. At the start (t0) of the first cycle, a precharge signal (PC1) of the SA1 becomes the "H" level, and the p-channel FET disposed inside the precharge circuit is turned off, and the bit line and the power supply line are disconnected from each other.

The word line (WL1) corresponding to the selected memory cell (MC1) becomes the "H" level, and a Q node of the selected memory cell (MC1) is connected to the source line (SL). On the other hand, non-selected word lines (WL2 to WL4) corresponding to the memory cells (MC2 to MC4) that are not selected are at the "L" level over the first cycle (t0 to t1).

Here, the selected memory cell MC1 stores data "0". In other words, the resistance of the first resistance changing element is lower than that of the second resistance changing element. The electric charges accumulated in the bit line (BL1) and the bit line (BL2) are discharged to the source line (SL) respectively through the first and second resistance changing elements. Since the resistance of the first resistance changing element is lower than that of the second resistance changing element, the electric potential of the bit line (BL1) decreases in a relatively speedy manner.

When the electric potential of the first bit line (BL1) is approximately VDD/2 or less, the output of the NAND gate to which the first bit line is connected, in other words, the $D1_L$ becomes the "H" level. As a result, since both the two input terminals of the NAND gate connected to the second bit line (BL2) become the "H" level, and the $D1_R$ becomes the "L" level.

For the second cycle (t1 to t2), the SA1 stores and outputs the data of the MC1.

At the start (t1) of the second cycle, the precharge signal (PC1) of the SA1 becomes the "L" level, and the p-channel FET disposed inside the precharge circuit is turned on, and both the bit lines are precharged to the "H" level. As a result, the RS-FF is in a hold mode, and the $D1_L$ and $D1_R$ respectively store the "H" level and the "L" level.

Thereafter, over the second cycle (t1 to t2), the SA1 stores the data of the MC1, and simultaneously, the stored data is output from a first output node. For the second cycle, a multiplexer (MUX) outputs the data supplied from the SA1 as an output OUT.

Here, as illustrated in FIG. 6, a keeper circuit may be further included which includes a first p-channel FET having a source and a drain connected between the power supply line and the bit line BL1 and a gate connected to the bit line BL2 and a second p-channel FET having a source and a drain connected between the power supply line and the bit line BL2 and a gate connected to the bit line BL1.

In a case where a ratio ($R_{HRS}/R_{LRS}$) of resistance ($R_{HRS}$) of a resistance changing element that is in a high resistance state (HRS) to resistance ($R_{LRS}$) of a resistance changing element that is in a low resistance state (LRS) is small, during the period of the first cycle (t0 to t1), there is a possibility that the electric potentials of both the two bit lines become approximately VDD/2 or less, and a reading operation fails. The keeper circuit detects a bit line of which the electric potential decreases first, out of the two bit lines and starts charging the other bit line.

Accordingly, it can be prevented that both the two bit lines are at the "L" level. By including the keeper circuit, the sensitivity of the sense amplifier is improved. In other words, data can be read from a memory cell of which the ratio of $R_{HRS}/R_{LRS}$ is relatively small.

The SA2 outputs data stored in the SA2 for the first cycle and reads data of the memory cell 2 (MC2) that is a selected memory cell for the second cycle. The reading and storing operation performed by the SA2 is the same as that of the SA1.

According to the MCM-II, as illustrated in FIG. 8, the precharge phase (PC) and the hold phase can be configured to be common. Thus, the circuits for generating control signals used for controlling the above-described operations can be configured to be simple, in other words, configured to have a small area. In addition, since the MCM-II includes only two control signal lines PC1 and PC2, wirings relating to the control signals can be configured to be simple. This leads to a decrease in the area of the MCM-II.

Third Embodiment

FIG. 9 illustrates the circuit diagram of a multi-context configuration memory (MCM-III) according to a third embodiment.

The MCM-III includes a plurality of memory cells (MCs) connected between first and second bit lines (BL1 and BL2). The first and second bit lines (BL1 and BL2) are connected to a driver 12. A source of a selection transistor of each memory cell is connected to a local output line (LO). The LO is connected to a sense amplifier (SA). The memory cells store respective configuration data of one bit and are connected to different words lines (WL1 to WL4). The word lines (WL1 to WL4) are connected to a driver 11. A control circuit 13 controls drivers 11 and 12, thereby controlling the electric potentials of the word lines (WL1 to WL4) and the first and second bit lines (BL1 and BL2).

The sense amplifier (SA) includes one output terminal, reads data of a selected memory cell, and simultaneously, continuously outputs the data from an output terminal (OUT).

As illustrated in FIG. 9, a plurality of MCM-III's arranged in the row direction can share the word lines (WL1 to WL4).

As the memory cell (MC), a memory cell similar to that of the first embodiment may be used.

The switching transistor, the first logic circuit and the second logic circuit in FIG. 1 may have applicability to the embodiment shown in FIG. 9.

FIG. 10 illustrates an example of the configuration of the sense amplifier (SA) of the MCM-III illustrated in FIG. 9.

In the figure, the same reference numeral is assigned to each same element as that illustrated in FIG. 9, and detailed description thereof will not be presented.

In this example, the SA is an inverter circuit.

The switching transistor, the first logic circuit and the second logic circuit in FIG. 1 may have applicability to the embodiment shown in FIG. 10.

FIG. 11 illustrates an operation waveform diagram of the circuit illustrated in FIG. 10.

In the figure, an operation corresponding to three cycles is illustrated.

In a first cycle (t0 to t1), the MCM-III reads data of a memory cell 1 (MC1) by using the SA and simultaneously, continuously outputs the data from an output terminal. In a second cycle (t1 to t2), the MCM-III reads data of a memory cell 2 (MC2) by using the SA and simultaneously, continuously outputs the data from the output terminal. In a third cycle (t2 to t3), the MCM-III reads data of a memory cell 3 (MC3) by busing the SA and simultaneously, continuously outputs the data from the output terminal.

In this way, the MCM-III can output the data of a different memory cell for each cycle.

The operation of the MCM-III, for example, for the first and second cycles (t0 to t2) will be described in detail.

When the MCM-III is operated, for example, the BL1 is constantly stored at power supply electric potential (VDD), and the BL2 is constantly stored at ground electric potential (Vss).

For example, when the electric potential of a Q node of the selected memory cell (MCx) is denoted by VQx, and the resistance values of the first and second resistance changing elements are respectively denoted by R1 and R2, $VQx=R2/(R1+R2)\times VDD$.

In a case where the selected memory cell MCx stores data "0", in other words, in a case where the resistance of a first resistance changing element is lower than that of a second resistance changing element, the electric potential VQx has a value ("H" level) larger than VDD/2. On the other hand, in a case where the memory cell stores data "1", in other words, in a case where the resistance of the first resistance changing element is higher than that of the second resistance changing element, the electric potential VQx has a value ("L" level) smaller than VDD/2.

As illustrated in FIG. 10, for the first cycle (t0 to t1), a word line 1 (WL1) corresponding to the memory cell 1 (MC1) becomes the "H" level, and the Q node of the MC1 is connected to the LO. On the other hand, word lines (WL2 and WL3) corresponding to remaining memory cells that are not selected are at the "L" level over the first cycle (t0 to t1). Accordingly, the Q node of each memory cell that is not selected is disconnected from the LO.

As a result, the electric potential (VQ1) of the Q node of the memory cell 1 (MC1) is transferred to the LO.

In this example, the memory cell 1 (MC1) stores data "0". Thus, the LO becomes the "H" level, and the configuration data output terminal (OUT) of the MCM-III becomes the "L" level.

For the second cycle (t1 to t2), a word line 2 (WL2) corresponding to the memory cell 2 (MC2) becomes the "H" level, and the Q node of the MC2 is connected to the LO. On the other hand, word lines (WL1 and WL3) corresponding to remaining memory cells that are not selected are at the "L" level over the second cycle (t1 to t2). Accordingly, the Q node of each memory cell that is not selected is disconnected from the LO.

As a result the electric potential (VQ2) of the Q node of the selected memory cell (MC2) is transferred to the LO.

In this example, the memory cell 2 (MC2) stores data "1". Thus, the LO becomes the "L" level, and the configuration data output terminal (OUT) of the MCM-III becomes the "H" level.

According to the MCM-III, control signal lines other than the word line are not arranged, and the circuit for generating control signals and a wiring thereof can be realized to have a small area.

Fourth Embodiment

Figure 12:
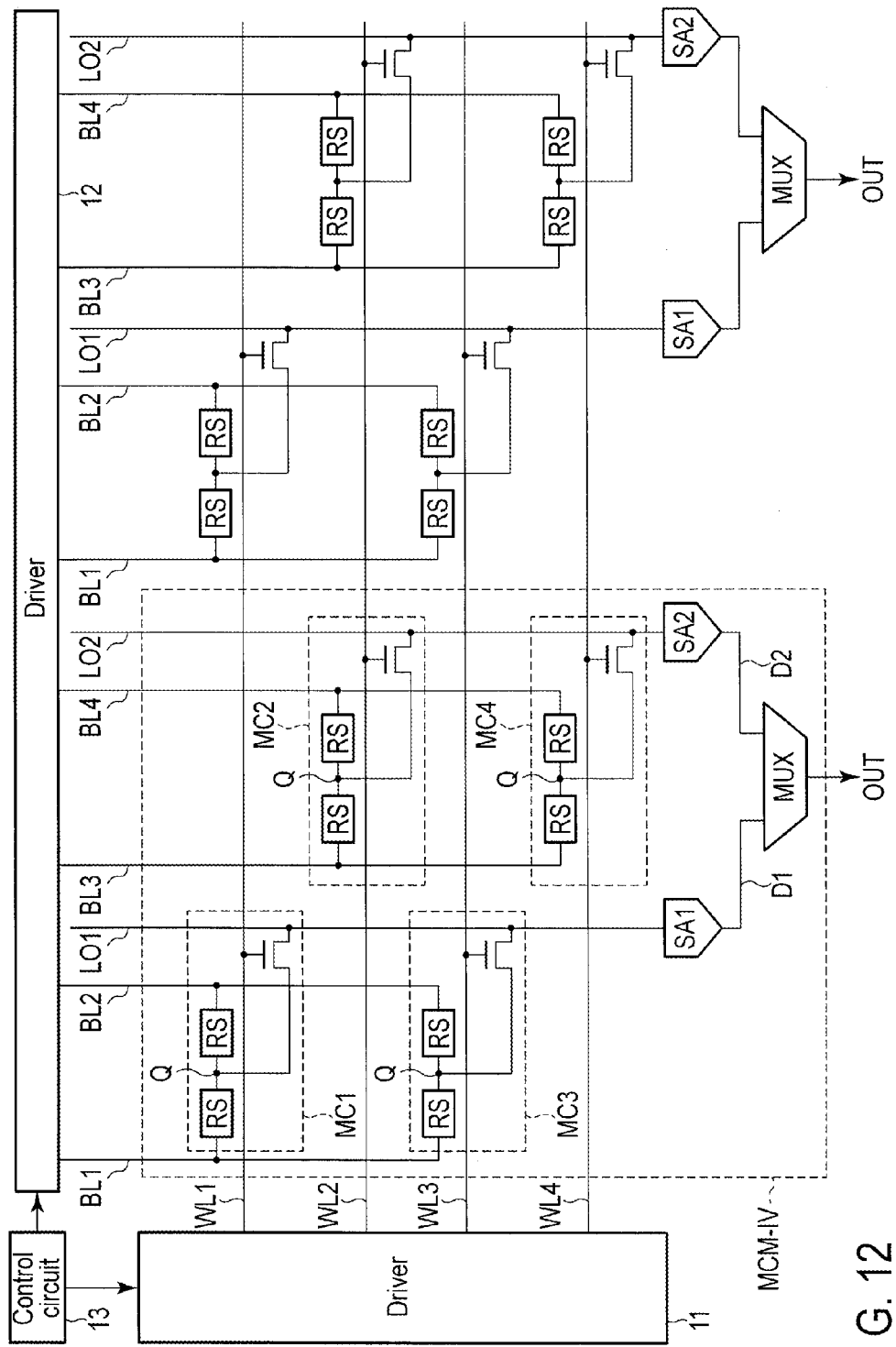
FIG. 12 is a diagram that illustrates the configuration of an MCM-IV.

FIG. 12 illustrates the circuit diagram of a multi-context configuration memory (MCM-IV) according to a fourth embodiment.

The MCM-IV includes a first column that includes a plurality of memory cells (MC1 and MC3) connected between first and second bit lines (BL1 and BL2) and a first sense amplifier (SA1), and a second column that includes a plurality of memory cells (MC2 and MC4) connected between third and fourth bit lines (BL3 and BL4) and a second sense amplifier (SA2). The first and second bit lines (BL1 and BL2) are connected to a driver 12.

A source of a selection transistor of each memory cell is connected to local output lines (LO1 and LO2). The LO1 is connected to the first sense amplifier (SA1), and the LO2 is connected to the second sense amplifier (SA2).

The memory cells store respective configuration data of one bit and are connected to different word lines (WL1 to WL4). The word lines (WL1 to WL4) are connected to a driver 11. The control circuit 13 controls the drivers 11 and 12, thereby controlling the electric potentials of the word lines (WL1 to WL4) and the first and second bit lines (BL1 and BL2).

Each of the sense amplifiers (SA1 and SA2) includes one output terminal (D1 or D2), reads data of the selected memory cell, and simultaneously, continuously outputs the data from the output terminal.

The MCM-IV includes a two-input/one-output multiplexer (MUX). The output terminals (D1 and D2) of the two sense amplifiers (SA1 and SA2) are connected to the input terminal of the multiplexer (MUX). The output terminal of the multiplexer (MUX) serves as a configuration data output terminal (OUT) of the MCM-IV.

As illustrated in FIG. 12, a plurality of MCM-IV's arranged in the row direction can share the word lines (WL1 to WL4).

As each of the memory cells (MC1 to MC4), a memory cell similar to that of the first embodiment may be used.

The switching transistor, the first logic circuit and the second logic circuit in FIG. 1 may have applicability to the embodiment shown in FIG. 12.

Figure 13:
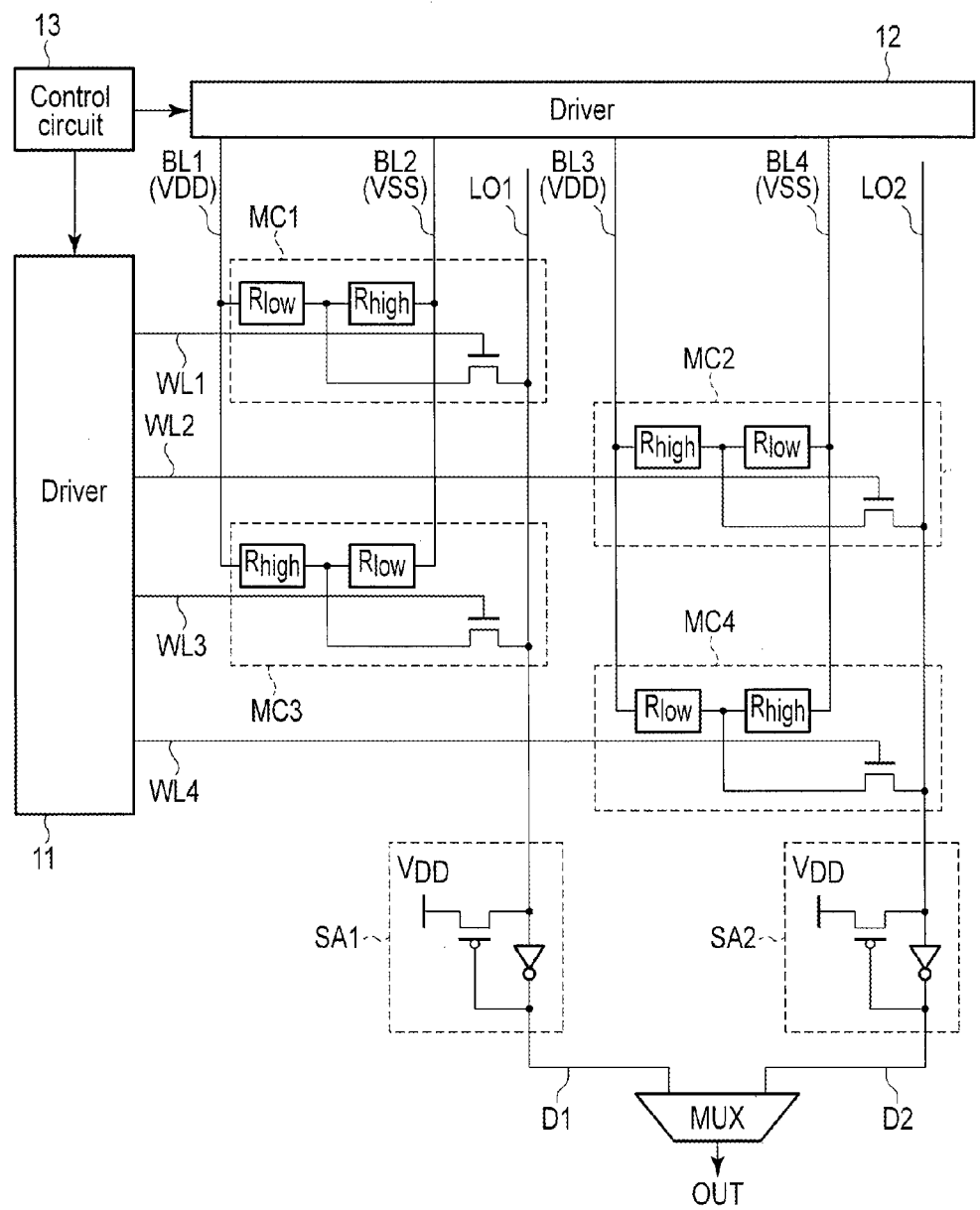
FIG. 13 is a diagram that illustrates an example of a sense amplifier of the MCM-IV.

FIG. 13 illustrates an example of the configuration of the first and second sense amplifiers (SA1 and SA2) of the MCM-IV illustrated in FIG. 12.

In the figure, the same reference numeral is assigned to each same element as that illustrated in FIG. 12, and detailed description thereof will not be presented.

In this example, each of the sense amplifiers SA1 and SA2 is configured by an inverter circuit and a P-channel FET.

The gate, the source, and the drain of the P-channel FET are respectively connected to an output terminal of the inverter circuit, a power supply line, and an input terminal of the inverter circuit. When a Q node of the selected memory cell is at the logical "H" level, in other words, VDD/2 or more, the P-channel FET fixes the electric potentials of the local output lines (LO1 and LO2) to a power supply voltage VDD.

The switching transistor, the first logic circuit and the second logic circuit in FIG. 1 may have applicability to the embodiment shown in FIG. 13.

Figure 14:
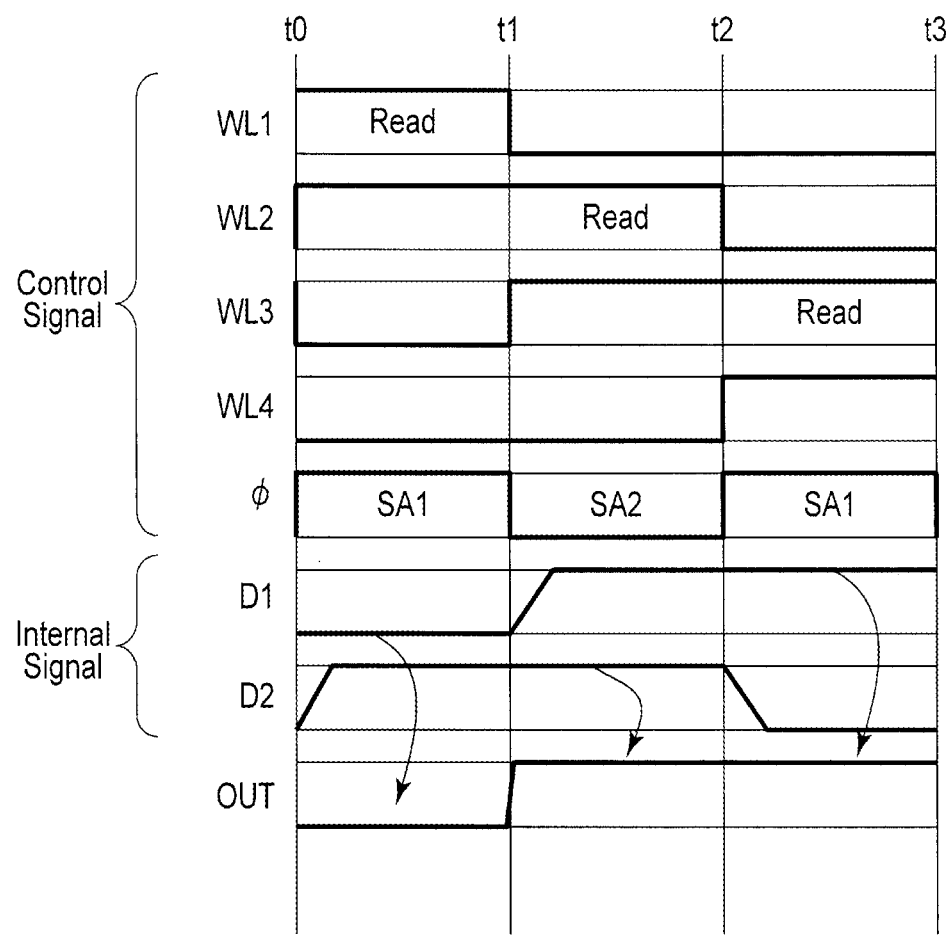
FIG. 14 is a diagram that illustrates an operation waveform of the circuit illustrated in FIG. 13.

FIG. 14 illustrates an operation waveform diagram of the circuit (MCM-IV) illustrated in FIG. 12.

In the figure, an operation corresponding to three cycles is illustrated.

In a first cycle (t0 to t1), the MCM-IV reads data of the memory cell 1 (MC1) by using the SA1 and simultaneously, continuously outputs the data from an output terminal (OUT).

In a second cycle (t1 to t2), the MCM-IV reads data of a memory cell 2 (MC2) by using the SA2 and simultaneously, continuously outputs the data from the output terminal (OUT). In a third cycle (t2 to t3), the MCM-IV reads data of a memory cell 3 (MC3) according to the data by using the SA1 and simultaneously, continuously outputs the data from the output terminal (OUT).

In this way, the MCM-IV can output the data of a different memory cell for each cycle.

The operation of the MCM-IV, for example, for the first and second cycles (t0 to t2) will be described in detail.

When the MCM-IV is operated, for example, the BL1 and BL3 are constantly stored at power supply electric potential (VDD), and the BL2 and BL4 are constantly stored at ground electric potential (Vss).

For example, as illustrated in FIG. 14, for the first cycle (t0 to t1), a word line 1 (WL1) corresponding to a memory cell 1 (MC1) that is a selected memory cell is at the "H" level, and the Q node of the memory cell MC1 is connected to the local output line LO1. In addition, for the first cycle (t0 to t1), a word line 2 (WL2) corresponding to a memory cell 2 (MC2) that is a selected memory cell of the second cycle (t1 to t2) becomes the "H" level, and the Q node of the memory cell MC2 is connected to the local output line LO2. On the other hand, word lines (WL3 and WL4) corresponding to the remaining memory cells are at the "L" level over the first cycle (t0 to t1). Accordingly, Q nodes of the remaining memory cells are disconnected from the local output lines (LO1 and LO2).

As a result, the electric potential (VQ1) of the Q node of the selected memory cell (MC1) is transferred to the LO1.

In this example, as illustrated in FIG. 13, the selected memory cell (MC1) stores data "0". Thus, the LO1 becomes the "H" level, and the output terminal (D1) of the sense amplifier (SA1) becomes the "L" level, whereby the configuration data output terminal (OUT) of the MCM-IV becomes the "L" level.

For the second cycle (t1 to t2), a word line 2 (WL2) corresponding to a memory cell 2 (MC2) that is a selected memory cell is at the "H" level, and the Q node of the memory cell MC2 is connected to the local output line LO2. In addition, for the second cycle (t1 to t2), a word line 3 (WL3) corresponding to a memory cell 3 (MC3) that is a selected memory cell of the third cycle (t2 to t3) becomes the "H" level, and the Q node of the memory cell MC3 is connected to the local output line LO1. On the other hand, word lines (WL1 and WL4) corresponding to the remaining memory cells are at the "L" level over the second cycle (t1 to t2). Accordingly, Q nodes of the remaining memory cells are disconnected from the local output lines (LO1 and LO2).

As a result, the electric potential (VQ2) of the Q node of the selected memory cell (MC2) is transferred to the LO2.

In this example, as illustrated in FIG. 13, the selected memory cell (MC2) stores data "1". Thus, the LO2 becomes the "L" level, and the output terminal (D2) of the SA2 becomes the "H" level, whereby the configuration data output terminal (OUT) of the MCM-IV becomes the "H" level.

According to the MCM-IV, control signal lines other than the word line are not arranged, and the circuit for generating control signals and a wiring thereof can be realized to have a small area.

Fifth Embodiment

Figure 15:
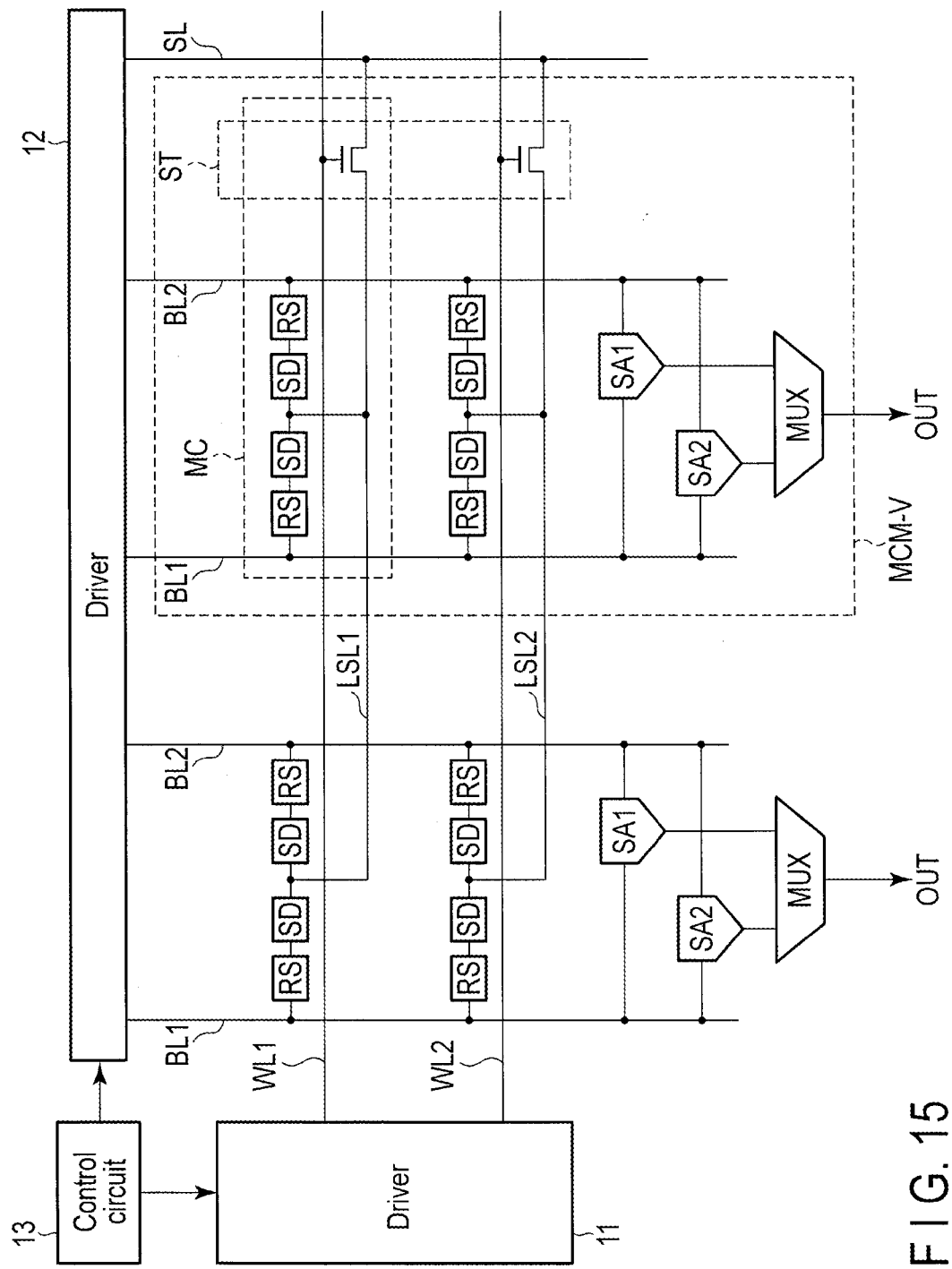
FIG. 15 is a diagram that illustrates the configuration of an MCM-V.

FIG. 15 illustrates the circuit diagram of a multi-context configuration memory (MCM-V) according to a fifth embodiment.

The MCM-V includes a plurality of memory cells (MCs) connected between first and second bit lines (BL1 and BL2) and two sense amplifiers (SA1 and SA2). The first and second bit lines (BL1 and BL2) are connected to a driver 12. The memory cells store respective configuration data of one bit and are connected to different words lines (WL1 and WL2). The word lines (WL1 and WL2) are connected to a driver 11. A control circuit 13 controls the drivers 11 and 13, thereby controlling the electric potentials of the word lines (WL1 and WL2) and the first and second bit lines (BL1 and BL2).

Each sense amplifier includes one output terminal, reads data stored by the memory cell selected by the word line, and thereafter stores and simultaneously outputs the data continuously from the output terminal. The MCM-V further includes a two-input/one-output multiplexer (MUX). The output terminals of the two sense amplifiers are connected to the input terminal of the multiplexer, and the output terminal of the multiplexer serves as a configuration data output terminal (OUT) of the MCM-V.

The memory cell (MC) includes: a first resistance changing element (RS) and a first select device (SD) that are connected in series between the first bit line (BL1) and a local source line (LSL); a second RS and a second SD that are connected in series between the second bit line (BL2) and the local source line (LSL); and a shared selection transistor (Shared ST) having a drain connected to the LSL.

The local source line (LSL) and the shared selection transistor (Shared ST) are configured to be common to a plurality of memory cells belonging to a plurality of MCM-V's.

It may be configured such that the memory cell illustrated in FIG. 15 is changed, and a memory cell as illustrated in FIG. 16 is used. The memory cell (MC) includes: first and second resistance changing elements (RS) that are connected in series between the first and second bit lines (BL1 and BL2); a select device (SD) that is arranged between a connection node (Q) disposed between the first and second resistance changing elements and the local source line (LSL); and a shared selection transistor (Shared ST) having a drain connected to the local source line (LSL).

As the resistance changing element (RS), the non-volatile resistance changing element having two terminals or the non-volatile resistance changing element having three terminals described in the first embodiment may be used.

Here, a representation of the select device (SD) means that, by selecting a selected memory cell MC (context), in other words, by discharging or charging the local source line of the selected memory cell MC (context) at the time of reading data, the local source line of the memory cell MC (context) that is not selected and the first and second bit lines (BL1 and BL2) are not conductive to each other (see FIGS. 20A and 20B).

As the select device (SD), for example, a rectifier (diode) may be used. In such a case, as illustrated in FIG. 17, the anode of the rectifier is arranged on the bit line side, and the cathode thereof is arranged on the local source line side. In other words, the rectifier is arranged such that a forward direction of the rectifier is a direction from the bit line to the local source line.

As the rectifier, a PN-type diode formed by a junction between a p-type semiconductor and an n-type semiconductor or a metal-insulator-metal (MIM)-type diode may be used. As the PN-type diode, an n-type Si/p-type Si diode or an n-type Ge/p-type Ge diode may be used. The MIM-type diode may have a structure sandwiched by an insulating film (insulator) and two types of metal. The two types of metal have different heights ($\Delta Ec$) of electron barriers, metal having a small $\Delta Ec$ becomes the cathode, and metal having a large $\Delta Ec$ becomes the anode. As the MIM-type diode, for example, Ti/TiOx/M, Ti/TaOx/M, Ti/TaOx: Ti/M, Ti/HfOx: Ti/M may be used. Here, M is metal having a work function larger (deeper) than Ti such as TiN, TaC, TaN, or W. In addition, TaOx: Ti and HfOx: Ti are respectively a Ti-added Ta oxide and a Ti-added Hf oxide.

In addition, as the select device (SD), a threshold switch device (TSw) may be used. The threshold switch device, as illustrated in FIG. 18, when the applied voltage is raised from 0 V, stores a high-resistance state up to an On-voltage (Von), changes to be in a low-resistance state at Von, and stores the low-resistance state at a higher voltage.

On the other hand, when the applied voltage is lowered from a value that is Von or more to 0 V, the threshold switch device stores the low-resistance state up to a hold voltage (Vhold), changes into a high-resistance state at Vhold, and stores the high-resistance state at a lower voltage. Here, Vhold is configured to be lower than Von. The threshold switch device, as illustrated in FIG. 18, can perform a bipolarity operation.

As the threshold switch device (TSw), a structure may be employed in which a metal-insulator phase transition (MIT) material is interposed between two metal electrodes. The metal-insulator phase transition material is a material that irreversibly changes between metal and an insulator with a threshold (a voltage, a current, or the like) being used as a boundary. As the MIT material, a vanadium oxide (VOx), particularly, a vanadium divalent oxide (VO2) may be used. In addition, as the metal electrode, a stable metal electrode material such as TiN, TaC, TaN, or W may be used.

When the memory cell stores data "0", the resistance of the first resistance changing element is lower than that of the second resistance changing element. On other hand, when the memory cell stores data "1", the resistance of the first resistance changing element is higher than that of the second resistance changing element. In other words, by programming the relative magnitudes of the resistance values of the two resistance changing elements in a complementary manner, data of one bit is recorded by the memory cell.

Since the operation of the MCM-V is the same as that of the MCM-I according to the first embodiment, description thereof will not be presented.

In this example, one common selection transistor is disposed for the plurality of memory cells. For this reason, the number of selection transistors can be decreased by a large amount, and an effective area on the surface of the Si substrate can be configured to be small.

The role of the select device (SD) required for enabling a common selection transistor configuration will be described with reference to FIGS. 19 and 20.

First, a reading error due to a sneak current that is generated in a case where the select device (SD) is not present will be described with reference to FIG. 19.

In a precharge phase illustrated in FIG. 19(a), all the bit lines (BL11, BL12, BL21, BL22, BL31, and BL32) are precharged up to precharge electric potential Vpre. At this time, all the local source lines (LSL1, LSL2, and LSL3) are charged up to Vpre through the resistance changing element of the low resistance ($R_{low}$).

In a reading phase illustrated in FIG. 19(b), the word line 3 (WL3) is selected (becomes the "H" level), and reading of a memory cell (selected memory cell) to which the LSL3 is connected is performed.

The shared ST to which the WL3 is connected is turned on, and the electric potential of the LSL3 becomes the ground electric potential (Vss). Then, electric charge accumulated in one of the bit line pairs (BL11/BL12, BL21/BL22, and BL31/BL32) is discharged through the RS, which has low resistance ($R_{low}$), of the selected memory device. As a result, the electric potential of one of the bit line pairs decreases from Vpre. In the example illustrated in FIG. 19(b), the electric potentials of the bit lines BL12, BL22, and BL32 decrease.

In the example illustrated in FIG. 19(b), a sneak current is generated together with a decrease in the electric potential of the bit line. For example, a sneak current is generated in paths represented as P2 and P1 together with a decrease in the electric potential of the BL12. A decrease (discharge) in the electric potential of the bit line BL21 that is to originally store Vpre and an increase (charge) in the electric potential of the bit line BL12 that is originally to be decreased up to Vss occur. This leads to a reading error.

In order to suppress the sneak current, it is necessary to suppress a current flowing in a direction from the local source line (LSL) to the bit line.

The suppression of the sneak current using the select device (SD) will be described with reference to FIG. 20.

In a precharge phase illustrated in FIG. 20(a), all the bit lines (BL11, BL12, BL21, BL22, BL31, and BL32) are precharged to the precharge electric potential Vpre. At this time, all the local source lines (LSL1, LSL2, and LSL3) are charged up to "Vpre-$\alpha$" through the resistance changing element of the low resistance ($R_{low}$). Here, $\alpha$ is the forward threshold voltage (Vtdio) of the rectifier and corresponds to Vhold of the threshold switch device.

In a reading phase illustrated in FIG. 20(b), similar to the case illustrated in FIG. 19(b), reading of a memory cell (selected memory cell) to which the LSL3 is connected is performed. In the example illustrated in FIG. 20(b), electric potentials of the bit lines BL12, BL22, and BL32 decrease.

In the case illustrated in FIG. 20(b), even when a decrease in the electric potential of the bit line occurs, the select device (SD) is present, and accordingly, a sneak current is not generated.

In a case where the select device is a rectifier, a current flowing in a direction from the local source line to the bit line is a reverse current of the rectifier and is blocked.

In a case where the select device is a threshold switch device, since a voltage difference between the local source line and the bit line is Von or less, a current flowing in a direction from the local source line to the bit line is blocked.

Here, it is preferable that a relation of "(Vpre−2×Vhold) <Von<Vpre" is satisfied. The reason is as follows. In order to enable discharge of the bit line according to the selected memory cell, it is necessary that "Von<Vpre". As a result of the discharge of the bit line according to the selected memory cell, at the lowest, the electric potential of the bit line decreases up to Vhold. Since a maximal voltage difference between the local source line and the bit line is "Vpre−2×Vhold", in a case where the maximal voltage difference is Von or less, a sneak current flowing from the local source line to the bit line can be suppressed.

The switching transistor, the first logic circuit and the second logic circuit in FIG. 1 may have applicability to the embodiment shown in FIG. 15.

(Write/Erase Technique)

Since write/erase techniques used for the multi-context configuration memories (MCM-I, MCM-II, MCM-III, MCM-IV, and MCM-V) described above are common, it will be described here altogether.

First, an example of a case where the resistance changing element (RS) is a non-volatile resistance changing element having two terminals will be described with reference to FIGS. 21 and 22. In this example, a case will be described in which four memory cells (MC11, MC12, MC21, and MC22) are arranged in two rows×two columns.

Here, conductive wires to which the sources of the selection transistors are connected will be referred to as source lines (SL1 and SL2). In addition, the first resistance changing element (111) disposed inside the memory cell (MC11) and the second resistance changing element (212) disposed inside the memory cell (MC21) will be regarded as selected devices that are write/erase targets.

Write (Set) Operation

Figure 21:
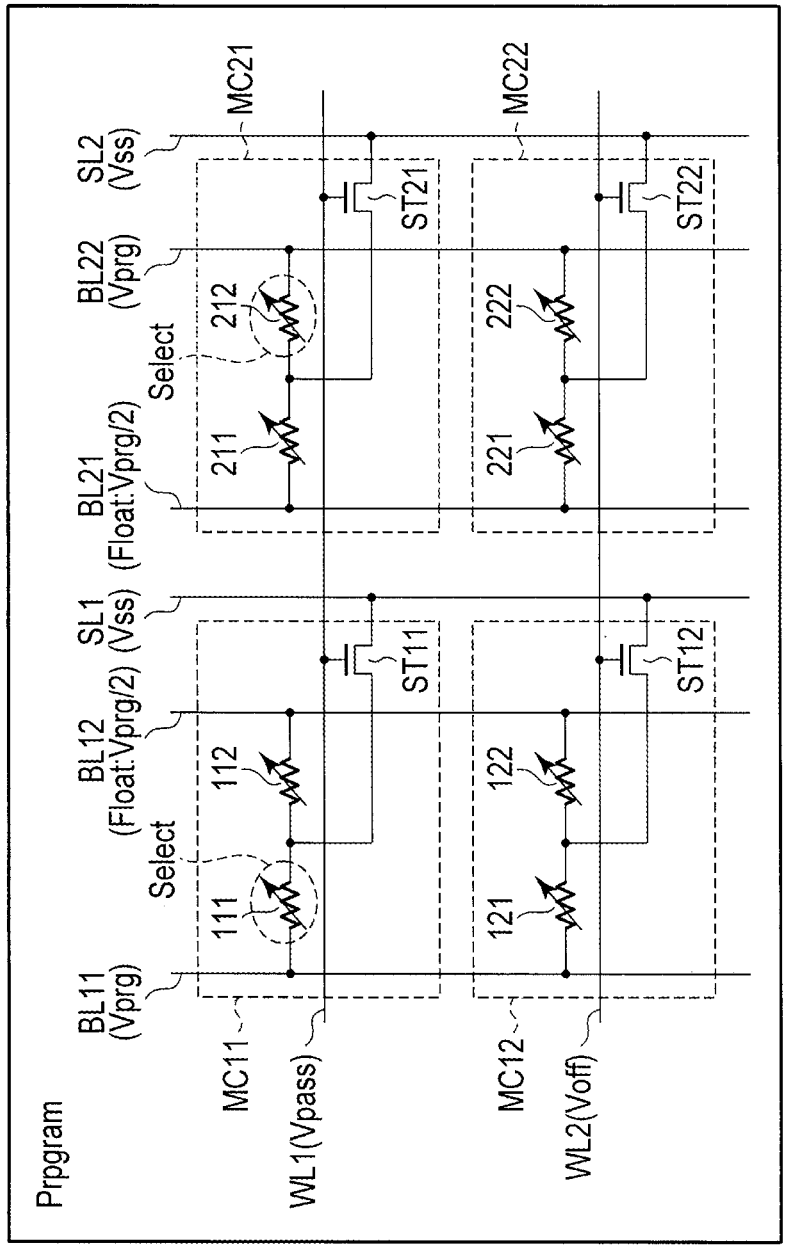
FIG. 21 is a diagram that illustrates a write operation performed by a two-terminal device.

In a write operation, voltages as illustrated in FIG. 21 are applied.

In other words, a program voltage (Vprg) pulse is applied to selected bit lines (BL11 and BL22). Non-selected bit lines (BL12 and BL21) are configured to be in a floating state, or Vprg/2 is applied to the non-selected bit lines. A Vpass voltage that is equal to or higher than the threshold voltage of the selection transistors (ST11 and ST21) is applied to a selected word line (WL1). A Voff voltage equal to or lower than the threshold voltage of the selection transistors (ST12 and ST22) is applied to a non-selected word line (WL2). The ground voltage (Vss) is applied to all the source lines (SL1 and SL2).

As a result, the Vprg pulse is selectively applied to the resistance changing elements (111 and 212) that are select devices, and the resistance changing elements (111 and 212) are in a low-resistance state.

Erase (Reset) Operation

Figure 22:
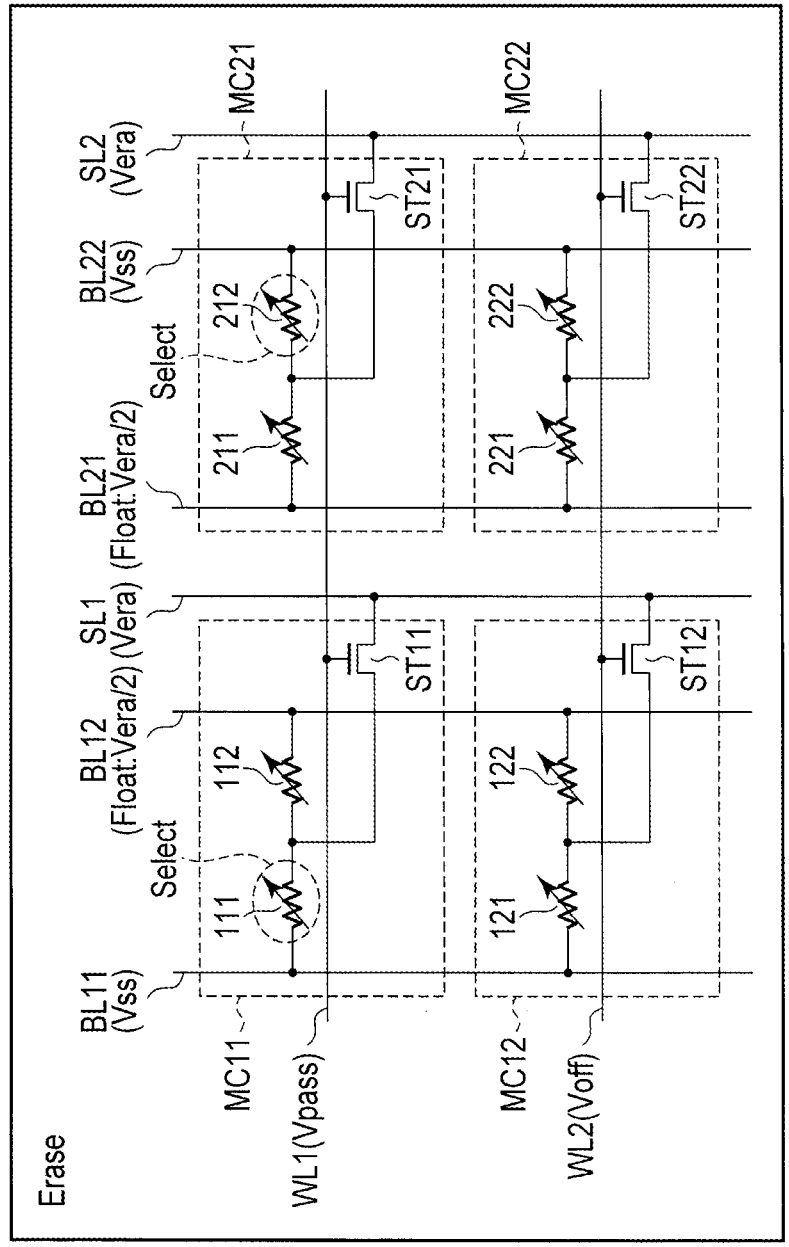
FIG. 22 is a diagram that illustrates an erase operation of a two-terminal device.

In a case where the non-volatile resistance changing element having two terminals is a bipolar type, in an erase operation, voltages as illustrated in FIG. 22 are applied.

In other words, an erase voltage (Vera) pulse is applied to all the source lines (SL1 and SL2). In addition, the ground voltage (Vss) is applied to the selected bit lines (BL11 and BL22). The non-selected bit lines (BL12 and BL21) are set to be in a floating state, or Vera/2 is applied to the non-selected bit lines. The Vpass voltage is applied to the selected word line (WL1), and the Voff voltage is applied to the non-selected word line (WL2).

As a result, a Vera pulse is selectively applied to the resistance changing elements (111 and 212) that are select devices, and such resistance changing elements (111 and 212) are in the high resistance state.

In addition, in a case where a rectifier is used in the MCM-V, it is necessary for the rectifier to transmit both the Vprg pulse and the Vera pulse that are in the opposite directions. While the rectifier needs to represent rectifying characteristics at a voltage at the level of the precharge voltage (Vpre), it is necessary for the rectifier to lose the rectifying characteristics at Vprg or Vera that is higher than Vpre (breakdown).

In a case where the non-volatile resistance changing element having two terminals is a unipolar type, an erase operation is the same as the write operation illustrated in FIG. 21 except that the Vprg pulse is changed to the Vera pulse. The Vera pulse is different from the Vprg pulse in any one of a voltage value, a pulse width, a rise time, and a fall time.

In addition, in the case of the unipolar type, the erase operation may be the same as that illustrated in FIG. 22. In such a case, the write operation is the same as the erase operation illustrated in FIG. 22 except that the Vera pulse is changed to the Vprg pulse.

Next, write/erase/read techniques of a case where the resistance changing element (RS) is a non-volatile resistance changing element having three terminals will be described with reference to FIGS. 23, 24, and 25. In this example, a read operation will be described as well.

In addition, in this example, a case will be described in which four memory cells (MC11, MC12, MC21, and MC22) are arranged in two rows×two columns.

Here, it is assumed that the non-volatile resistance changing element having three terminals is a non-volatile memory transistor. In addition, conductive wires to which the sources of the selection transistors are connected will be referred to as source lines (SL1 and SL2). The gates of two non-volatile memory transistors disposed inside one memory cell are connected to memory selection word lines (MWL1 and MWL2) to be common thereto. In addition, a plurality of memory cells arranged in the row direction share memory selection word lines (MWL1 and MWL2).

Write Operation

In the write operation, for example, voltages as illustrated in FIG. 23 are applied.

Here, the first resistance changing element (111) disposed inside the memory cell (MC11) and the second resistance changing element (212) disposed inside the memory cell (MC21) will be regarded as selected devices that are write targets.

In such a case, a write drain voltage (Vd_prg) pulse is applied to selected bit lines (BL11 and BL22). The ground voltage (Vss) is applied to the non-selected bit lines (BL12 and BL21). A write gate voltage (Vg_prg) is applied to a memory selection word line (MWL1) corresponding to a selected row. In addition, the ground voltage (Vss) is applied to a memory selection word line (MWL2) corresponding to a non-selected row.

As a result, the threshold voltage of the resistance changing elements (111 and 212) that are select devices rises according to channel hot electron injection to be Vth_high.

At this time, it is preferable that a voltage (Vpass) that is the threshold voltage of the selection transistors (ST11, ST12, ST21, and ST22) or more is applied to the word lines (WL1 and WL2), and the ground voltage (Vss) is applied to the source lines (SL1 and SL2). Instead of this, the word lines (WL1 and WL2) and the source lines (SL1 and SL2) may be set to be in a floating state.

Erase Operation

In an erase operation, for example, voltages as illustrated in FIG. 24 are applied.

Here, the first resistance changing elements (111, 121, 211, and 221) and the second resistance changing elements (112, 122, 212, and 222) disposed in all the memory cells (MC11, MC12, MC21, and MC22) are assumed to be selected devices that are erase targets (batch erase).

In such a case, the ground voltage (Vss) is applied to all the bit lines (BL11, BL12, BL21, and BL22), and an erase voltage (Vera) pulse is applied to all the memory selection word lines (MWL1 and MWL2).

As a result, the threshold voltage of all the first and second resistance changing elements (111, 121, 211, 221, 112, 122, 212, and 222) decreases according to a FN tunneling (Fowler-Nordheim Tunneling) current to be Vth_low.

At this time, it is preferable that a voltage (Vpass) that is the threshold voltage of the selection transistors (ST11, ST12, ST21, and ST22) or more is applied to the word lines (WL1 and WL2), and the ground voltage (Vss) is applied to the source lines (SL1 and SL2). Instead of this, the word lines (WL1 and WL2) and the source lines (SL1 and SL2) may be set to be in a floating state.

Read Operation

In a read operation, for example, voltages as illustrated in FIG. 25 are applied.

Here, memory cells (MC11 and MC21) that are connected to the word line (WL1) are assumed to be selected devices that are reading targets.

In such a case, a read voltage (Vread) that is a voltage between Vth_low and Vth_high is applied to all the memory selection word lines (MWL1 and MWL2). In addition, the Vpass voltage is applied to the selected word line (WL1). The ground voltage (Vss) is applied to a non-selected word line (WL2).

(Redundancy Bit)

In configuring an array of multi-context configuration memories (MCM), there is a possibility that a defective bit occurs in a plurality of the MCMs. FIG. 26 illustrates an example of the configuration of an MCM array that has a redundancy bit. In the MCM array having one redundancy bit, even when there is one defective bit, a normal function as the MCM array can be stored.

The MCM array having a redundancy bit illustrated in FIG. 26 includes configuration data output nodes (M1 to M8) of 8 bits, MCMs (MCM0 to MCM8) of 9 bits, eight two-input one-output MUXs (MUX1 to MUX8); and eight control memories (CM1 to CM8). As the MCM, one of the multi-context configuration memories (MCM-I, MCM-II, MCM-III, MCM-IV, and MCM-V) described above may be used.

The number of MCMs is larger than the number of configuration data output nodes by a redundancy bit. In this example, MCM0 is the redundancy bit. The output nodes of the MUXs (MUX1 to MUX8) serve as configuration data output nodes (M1 to M8). The output terminal (OUTn−1) of the (n−1)-th MCM is connected to an input terminal disposed on the left side of the n-th MUX (MUXn), and, the output terminal (OUTn) of the n-th MCM is connected to an input terminal disposed on the right side. The output terminal of a control memory (CM) is connected to a control terminal of the MUX (MUX). When "0" is input from CMn, the MUXn outputs input data for the input terminal disposed on the left side from an output terminal (Mn). On the other hand, when "1" is input from CMn, the MUXn outputs input data for the input terminal disposed on the right side from the output terminal (Mn).

When there is no defective bit, "1"s are stored in all the control memories (CM1 to CM8). As a result, the output (MCMn) of the n-th MCM is output from the n-th configuration data output node (Mn). MCM0 that is a redundancy bit is not used.

In a case where there is a defective bit, the defective bit is not used, and MCM0 that is the redundancy bit is used instead of the defective bit. When the m-th bit is a defective bit, "0"s are stored in CM0 to CMm, and "1" are stored in CMm+1 and the subsequent control memories. As a result, the output (MCMk−1) of the (k−1)-th MCM is output from the k-th (here, k=<m) configuration data output node (Mk). On the other hand, the output (MCMl) of the l-th MCM is output from the l-th (here, l>m) configuration data output node (Ml). MCMm that is the defective bit is not used.

CONCLUSION

As above, according to an embodiment, a multi-context configuration memory configured by a non-volatile memory cell having a small cell area can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An integrated circuit comprising:
   first and second data lines;
   a first memory cell comprising first and second resistance changing elements connected in series between the first and second data lines and a first selection transistor including a drain connected to a connection node of the first and second resistance changing elements;
   a second memory cell comprising third and fourth resistance changing elements connected in series between the first and second data lines and a second selection transistor including a drain connected to a connection node of the third and fourth resistance changing elements;
   a first sense amplifier comprising first input terminals and a first output terminal, the first input terminals connected to the first and second data lines;
   a second sense amplifier comprising second input terminals and a second output terminal, the second input terminals connected to the first and second data lines;
   a multiplexer comprising third input terminals and a third output terminal, the third input terminals connected to the first and second output terminals; and
   a control circuit controlling operations of the first and second sense amplifiers and the multiplexer in reading data from the first or second memory cell.

2. The circuit of claim 1, wherein
   the control circuit transfers first data from the first memory cell to the first sense amplifier in a first cycle, transfers second data from the second memory cell to the second sense amplifier in a second cycle after the first cycle and outputs the first data stored in the first sense amplifier from the third output terminal in the second cycle, and controls an operation of outputting the second data stored in the second sense amplifier from the third output terminal in a third cycle after the second cycle, in reading data from the first and second memory cells.

3. The circuit of claim 1, wherein
   each of the first and second resistance changing elements is a non-volatile resistance changing element including two terminals.

4. The circuit of claim 1, wherein
   each of the first and second resistance changing elements is a non-volatile memory transistor including three terminals.

5. The circuit of claim 1, further comprising
a switching transistor including a control terminal, a first signal terminal and a second signal terminal, the control terminal receiving a control signal output from the third output terminal of the multiplexer;
a first logic circuit connected to the first signal terminal; and
a second logic circuit connected to the second signal terminal.

6. The circuit of claim 1, wherein
the control circuit controls electric potentials of the first and second data lines such that resistance of the first resistance changing element is lower than resistance of the second resistance changing element in programming first data for the first memory cell, and controls the electric potentials of the first and second data lines such that the resistance of the first resistance changing element is higher than the resistance of the second resistance changing element in programming second data for the first memory cell.

7. The circuit of claim 1, wherein
the control circuit sets electric potential of the first and second data lines to first electric potential, sets electric potential of a source of the first selection transistor to second electric potential different from the first electric potential, and controls an operation of detecting a difference between the electric potentials of the first and second data lines that occurs by turning on the first selection transistor using the first sense amplifier, in reading data from the first memory cell.

8. The circuit of claim 1,
wherein the first sense amplifier comprises:
first and second data nodes;
a first inverter comprising a first inverter input terminal connected to the first data node and a first inverter output terminal connected to the second data node;
a second inverter comprising a second inverter input terminal connected to the second data node and a second inverter output terminal connected to the first data node;
a first transfer transistor connected between the first data line and the first data node; and
a second transfer transistor connected between the second data line and the second data node, and
wherein the first output terminal is connected to one of the first and second data nodes.

* * * * *